US009390911B2

(12) United States Patent
Hirose et al.

(10) Patent No.: US 9,390,911 B2
(45) Date of Patent: Jul. 12, 2016

(54) METHOD OF MANUFACTURING SEMICONDUCTOR DEVICE

(71) Applicant: Hitachi Kokusai Electric Inc., Tokyo (JP)

(72) Inventors: Yoshiro Hirose, Toyama (JP); Ryota Sasajima, Toyama (JP); Yoshinobu Nakamura, Toyama (JP); Ryuji Yamamoto, Tokyo (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 13/846,185

(22) Filed: Mar. 18, 2013

(65) Prior Publication Data

US 2013/0252439 A1 Sep. 26, 2013

(30) Foreign Application Priority Data

Mar. 21, 2012 (JP) ................................ 2012-064465
Feb. 19, 2013 (JP) ................................ 2013-030452

(51) Int. Cl.

*H01L 21/31* (2006.01)
*H01L 21/02* (2006.01)
*C23C 16/30* (2006.01)
*C23C 16/455* (2006.01)

(52) U.S. Cl.

CPC ............ *H01L 21/0228* (2013.01); *C23C 16/30* (2013.01); *C23C 16/45531* (2013.01); *C23C 16/45546* (2013.01); *C23C 16/45557* (2013.01); *H01L 21/02126* (2013.01); *H01L 21/02167* (2013.01); *H01L 21/02211* (2013.01)

(58) Field of Classification Search

CPC .................... H01L 21/0228; H01L 21/28194; H01L 21/3141; H01L 45/1616
USPC .......................................... 438/758, 778, 784
See application file for complete search history.

(56) References Cited

U.S. PATENT DOCUMENTS

2006/0042544 A1* 3/2006 Hasebe et al. ................ 118/715
2010/0212593 A1* 8/2010 Takebayashi et al. ........ 118/725
2011/0076857 A1* 3/2011 Akae et al. .................... 438/769

* cited by examiner

*Primary Examiner* — Brook Kebede
(74) *Attorney, Agent, or Firm* — Edell, Shapiro & Finnan LLC

(57) ABSTRACT

A method includes: forming a thin film on a substrate by performing a cycle a predetermined number of times, the cycle including: (a) supplying a source gas to the substrate in a process chamber; and (b) supplying a reactive gas to the substrate in the process chamber, wherein at least one of (a) and (b) includes: (c) supplying the source gas or the reactive gas at a first flow rate with exhaust of an inside of the process chamber being suspended until an inner pressure of the process chamber reaches a predetermined pressure; and (d) supplying the source gas or the reactive gas at a second flow rate less than the first flow rate with exhaust of the inside of the process chamber being performed while maintaining the inner pressure of the process chamber at the predetermined pressure after the inner pressure of the process chamber reaches the predetermined pressure.

17 Claims, 9 Drawing Sheets

METHOD OF MANUFACTURING SEMICONDUCTOR DEVICE

CROSS REFERENCE TO RELATED APPLICATIONS

This application claims foreign priority under 35 U.S.C. §119(a)-(d) to Application No. JP 2012-064465 filed on Mar. 21, 2012, and to Application No. JP 2013-030452 filed on Feb. 19, 2013, the entire contents of each of which are hereby incorporated by reference.

FIELD OF THE INVENTION

The present invention relates to a method of manufacturing a semiconductor device including a process of forming a thin film on a substrate, a substrate processing apparatus, and a non-transitory computer-readable recording medium.

BACKGROUND

In some cases, a process of forming a thin film, such as a silicon oxide (SiO) film or a silicon nitride (SiN) film, on a substrate may be performed as a process included in a process of manufacturing a semiconductor device. The silicon oxide (SiO) film has high insulating properties and low dielectric properties and is thus widely used as an insulating film or an interlayer film. In addition, the silicon nitride (SiN) film has high insulating properties, high corrosion resistance, low dielectric properties, high film stress controllability, etc., and is thus widely used as an insulating film, a mask film, a charge accumulating film, or a stress control film. In addition, a technique of forming a thin film, such as a silicon carbonitride (SiCN) film, a silicon oxycarbonitride (SiOCN) film, a silicon oxycarbide (SiOC) film, or a silicon boron carbonitride (SiBCN) film, by adding carbon (C) and/or boron (B) to the silicon oxide (SiO) film and the silicon nitride (SiN) film has been known. An etching resistance of a thin film may be enhanced by adding carbon (C) thereto.

SUMMARY

A silicon oxycarbide (SiOC) film may be formed by supplying a source gas containing silicon (Si) (Si-source), a reactive gas containing oxygen (O) (oxygen-containing gas), and a reactive gas containing carbon (C) (carbon-containing gas) to a substrate in a process chamber. A silicon carbonitride (SiCN) film may be formed by supplying a Si source, a reactive gas containing nitrogen (N) (nitrogen-containing gas), and a carbon-containing gas to the substrate in the process chamber.

In order to increase the concentrations of oxygen, nitrogen, carbon, etc. contained in a thin film, such as the SiOC film or the SiCN film, it is effective to increase the flow rates of reactive gases (an oxygen-containing gas, a nitrogen-containing gas, and a carbon-containing gas) to be supplied into the process chamber. However, if the flow rates of the reactive gases increase, a total supply rate (consumption rate or usage rate) of the reactive gas may increase, thereby increasing film-forming costs. In particular, when expensive gases are used as reactive gases, film-forming costs are very high.

It is an object of the present invention to provide a method of manufacturing a semiconductor device, which is capable of reducing a total supply rate of reactive gases without lowering the concentrations of, for example, oxygen, nitrogen, and carbon contained in a thin film, a substrate processing apparatus, and a non-transitory computer-readable recording medium.

According to one aspect of the present invention, there is provided a method of manufacturing a semiconductor device, including: forming a thin film on a substrate by performing a cycle a predetermined number of times, the cycle including: (a) supplying a source gas to the substrate in a process chamber; and (b) supplying a reactive gas to the substrate in the process chamber, wherein at least one of the steps (a) and (b) includes: (c) supplying the source gas or the reactive gas at a first flow rate with an exhaust of an inside of the process chamber being suspended until an inner pressure of the process chamber reaches a predetermined pressure; and (d) supplying the source gas or the reactive gas at a second flow rate less than the first flow rate with the exhaust of the inside of the process chamber being performed while maintaining the inner pressure of the process chamber at the predetermined pressure after the inner pressure of the process chamber reaches the predetermined pressure.

According to another aspect of the present invention, there is provided a substrate processing apparatus including: a process chamber configured to accommodate a substrate; a source gas supply system configured to supply a source gas into the process chamber; a reactive gas supply system configured to supply a reactive gas into the process chamber; an exhaust system configured to exhaust an inside of the process chamber; a pressure regulator configured to regulate pressure in the process chamber; and a control unit configured to control the source gas supply system, the reactive gas supply system, the exhaust system, and the pressure regulator to form a thin film on the substrate by performing a cycle a predetermined number of times, the cycle including: (a) supplying a source gas to the substrate in a process chamber; and (b) supplying a reactive gas to the substrate in the process chamber, wherein at least one of the steps (a) and (b) includes: (c) supplying the source gas or the reactive gas at a first flow rate with an exhaust of an inside of the process chamber being suspended until an inner pressure of the process chamber reaches a predetermined pressure; and (d) supplying the source gas or the reactive gas at a second flow rate less than the first flow rate with the exhaust of the inside of the process chamber being performed while maintaining the inner pressure of the process chamber at the predetermined pressure after the inner pressure of the process chamber reaches the predetermined pressure.

According to still another aspect of the present invention, there is provided a non-transitory computer-readable recording medium storing a program that causes a computer to perform a sequence of forming a thin film on a substrate by performing a cycle a predetermined number of times, the cycle including: (a) supplying a source gas to the substrate in a process chamber; and (b) supplying a reactive gas to the substrate in the process chamber, wherein at least one of the sequences (a) and (b) includes: (c) supplying the source gas or the reactive gas at a first flow rate with an exhaust of an inside of the process chamber being suspended until an inner pressure of the process chamber reaches a predetermined pressure; and (d) supplying the source gas or the reactive gas at a second flow rate less than the first flow rate with the exhaust of the inside of the process chamber being performed while maintaining the inner pressure of the process chamber at the predetermined pressure after the inner pressure of the process chamber reaches the predetermined pressure.

DETAILED DESCRIPTION

First Embodiment of the Present Invention

A first embodiment of the present invention will now be described with reference to the appended drawings.

(1) Configuration of Substrate Processing Apparatus

Figure 1:
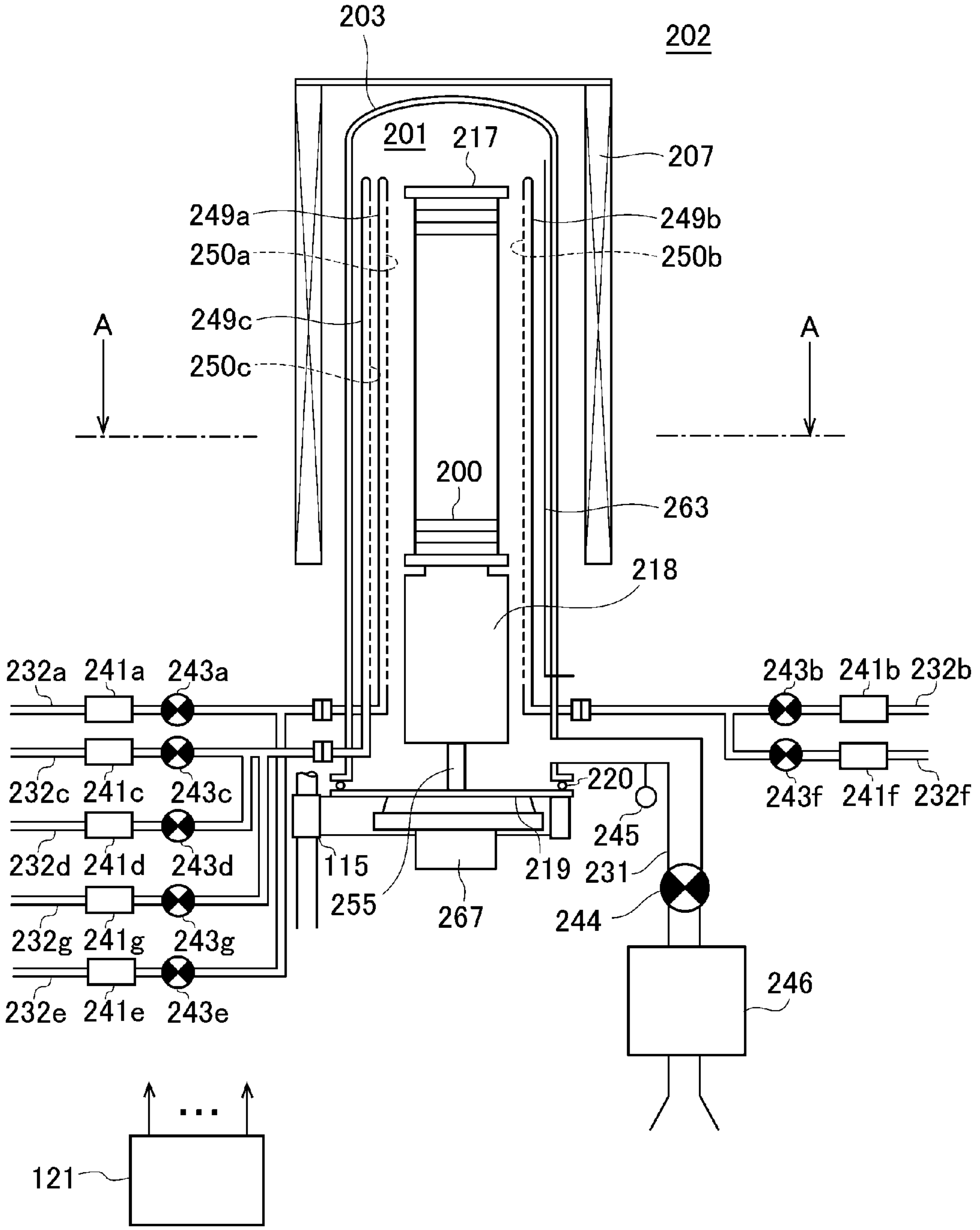
FIG. 1 is a schematic configuration view of a vertical processing furnace of a substrate processing apparatus according to an exemplary embodiment of the present invention, showing a portion of the processing furnace in a longitudinal cross-sectional view.
Figure 2:
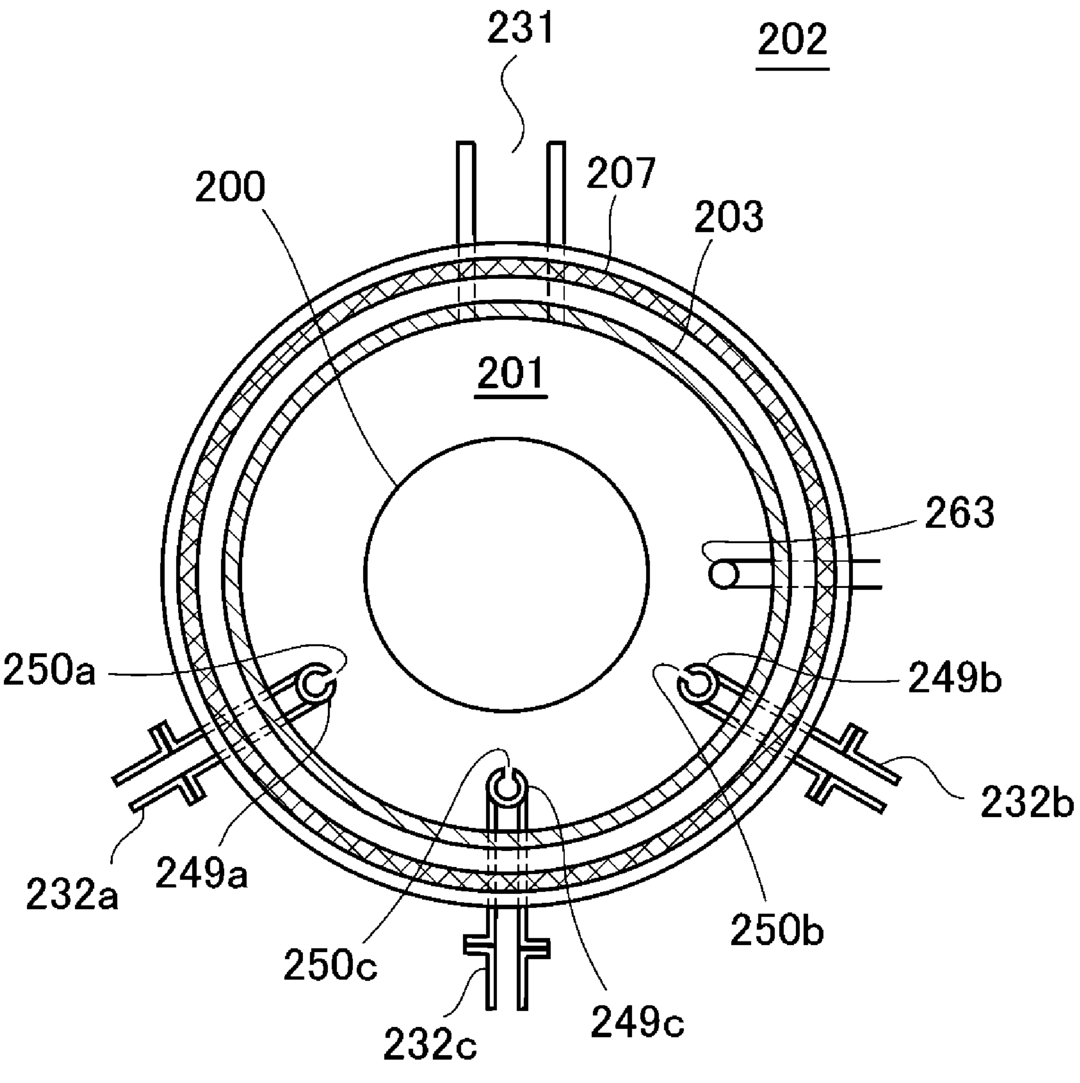
FIG. 2 is a schematic configuration view of the vertical processing furnace of the substrate processing apparatus according to an exemplary embodiment of the present invention, showing the portion of the processing furnace in a cross-sectional view taken along line A-A of FIG. 1.

FIG. 1 is a schematic configuration view of a vertical processing furnace 202 of a substrate processing apparatus according to an exemplary embodiment of the present invention, showing a portion of the processing furnace 202 in a longitudinal cross-sectional view. FIG. 2 is a schematic configuration view of the vertical processing furnace 202 according to an exemplary embodiment of the present invention, showing the portion of the processing furnace 202 in a cross-sectional view taken along line A-A of FIG. 1.

As illustrated in FIG. 1, the processing furnace 202 includes a heater 207 serving as a heating unit (heating mechanism). The heater 207 has a cylindrical shape and is supported by a heater base (not shown) serving as a holding plate to be vertically installed. In addition, the heater 207 functions as an activation mechanism (excitation unit) configured to thermally activate (excite) a gas as will be described below.

A reaction tube 203 constituting a reaction container (processing container) to be concentric with the heater 207 is installed inside the heater 207. The reaction tube 203 is formed of a heat-resistant material, such as quartz ($SiO_2$), silicon carbide (SiC), or the like, and has a cylindrical shape with an upper end closed and a lower end open. A process chamber 201 is formed in a hollow tubular portion of the reaction tube 203, and is configured such that wafers 200 serving as substrates may be accommodated by a boat 217 (to be described below) aligned in a horizontal posture in a multi-stage in a vertical direction.

A first nozzle 249*a*, a second nozzle 249*b*, and a third nozzle 249*c* are installed in the process chamber 201 to pass through a lower portion of the reaction tube 203. A first gas supply pipe 232*a*, a second gas supply pipe 232*b* and a third gas supply pipe 232*c* are connected to the first nozzle 249*a*, the second nozzle 249*b* and the third nozzle 249*c*, respectively. A fourth gas supply pipe 232*d* is connected to the third gas supply pipe 232*c*. As described above, the three nozzles 249*a*, 249*b*, and 249*c* and the four gas supply pipes 232*a*, 232*b*, 232*c*, and 232*d* are installed at the reaction tube 203 to supply a plurality of types (here, four types) of gases into the process chamber 201.

A manifold formed of metal and configured to support the reaction tube 203 may be installed under the reaction tube 203, and the nozzles 249*a*, 249*b*, and 249*c* may be installed to pass through a sidewall of the metal manifold. In this case, an exhaust pipe 231 (to be described later) may further be installed at the metal manifold. Alternatively, the exhaust pipe 231 may be installed at a lower portion of the reaction tube 203 instead of the metal manifold. As described above, a furnace port of the processing furnace 202 may be formed of a metal, and the nozzles 249*a*, 249*b*, and 249*c* or the like may be installed at the metal furnace port.

A mass flow controller (MFC) 241*a* serving as a flow rate controller (flow rate control unit) and a valve 243*a* serving as an opening/closing valve are installed at the first gas supply pipe 232*a* in sequence from an upstream side. In addition, a first inert gas supply pipe 232*e* is connected to the first gas supply pipe 232*a* downstream from the valve 243*a*. A mass flow controller 241*e* serving as a flow rate controller (flow rate control unit) and a valve 243*e* serving as an opening/closing valve are installed at the first inert gas supply pipe 232*e* in sequence from the upstream side. Further, the above-mentioned first nozzle 249*a* is connected to a tip section of the first gas supply pipe 232*a*. The first nozzle 249*a* is installed in an arc-shaped space between an inner wall of the reaction tube 203 and the wafer 200 from a lower portion to an upper portion of the inner wall of the reaction tube 203 to stand up in a stacking direction of the wafers 200. That is, the first nozzle 249*a* is installed in a region horizontally surrounding a wafer arrangement region, in which the wafers 200 are arranged, which is a side of the wafer arrangement region, along the wafer arrangement region. The first nozzle 249*a* is constituted by an L-shaped long nozzle, and has a horizontal section installed to pass through a lower sidewall of the reaction tube 203 and a vertical section installed to stand up at least from one end side to the other end side of the wafer arrangement region. A gas supply hole 250*a* configured to supply a gas is formed in a side surface of the first nozzle 249*a*. The gas supply hole 250*a* is opened toward a center of the reaction tube 203 so that a gas may be supplied toward the wafer 200. The plurality of gas supply holes 250*a* are formed from the lower portion to the upper portion of the reaction tube 203, have the same opening area, and are formed at the same opening pitch.

A first gas supply system mainly includes the first gas supply pipe 232*a*, the mass flow controller 241*a*, and the valve 243*a*. The first nozzle 249*a* may further be included in the first gas supply system. Further, a first inert gas supply system mainly includes the first inert gas supply pipe 232*e*, the mass flow controller 241*e*, and the valve 243*e*. The first inert gas supply system also functions as a purge gas supply system.

A mass flow controller (MFC) 241*b* serving as a flow rate controller (flow rate control unit) and a valve 243*b* serving as an opening/closing valve are installed at the second gas supply pipe 232*b* in sequence from the upstream side. In addition, a second inert gas supply pipe 232*f* is connected to the second gas supply pipe 232*b* downstream from the valve 243*b*. A mass flow controller 241*f* serving as a flow rate controller (flow rate control unit) and a valve 243*f* serving as an opening/closing valve are installed at the second inert gas supply pipe 232*f* in sequence from the upstream side. Further, the above-mentioned second nozzle 249*b* is connected to a tip section of the second gas supply pipe 232*b*. The second nozzle 249*b* is installed in an arc-shaped space between the inner wall of the reaction tube 203 and the wafer 200 from the lower portion to the upper portion of the inner wall of the reaction tube 203 to stand up in the stacking direction of the wafers 200. That is, the second nozzle 249*b* is installed at a region surrounding the wafer arrangement region in which the wafers 200 are arranged, which is a side of the wafer arrangement region, along the wafer arrangement region. The second nozzle 249*b* is constituted by an L-shaped long nozzle, and has a horizontal section installed to pass through the lower sidewall of the reaction tube 203 and a vertical section installed to stand up at least from the one end side to the other end side of the wafer arrangement region. A gas supply hole 250*b* configured to supply a gas is formed in a side surface of the second nozzle 249*b*. The gas supply hole 250*b* is opened toward the center of the reaction tube 203 so that a gas may be supplied toward the wafer 200. The plurality of gas supply holes 250*b* are installed from the lower portion to the upper portion of the reaction tube 203, have the same opening area, and are installed at the same opening pitch.

A second gas supply system mainly includes the second gas supply pipe 232*b*, the mass flow controller 241*b* and the valve 243*b*. The second nozzle 249*b* may be further included in the second gas supply system. Further, a second inert gas supply system mainly includes the second inert gas supply pipe 232*f*, the mass flow controller 241*f*, and the valve 243*f*. The second inert gas supply system may function as a purge gas supply system.

A mass flow controller (MFC) 241*c* serving as a flow rate controller (flow rate control unit) and a valve 243*c* serving as an opening/closing valve are installed at the third gas supply pipe 232*c* in sequence from the upstream side. In addition, the fourth gas supply pipe 232*d* is connected to the third gas supply pipe 232*c* downstream from the valve 243*c*. A mass flow controller 241*d* serving as a flow rate controller (flow rate control unit) and a valve 243*d* serving as an opening/closing valve are installed at the fourth gas supply pipe 232*d* in sequence from the upstream side. Further, a third inert gas supply pipe 232*g* is connected to the third gas supply pipe 232*c* downstream from a connecting place to the fourth gas supply pipe 232*d*. A mass flow controller 241*g* serving as a flow rate controller (flow rate control unit) and a valve 243*g* serving as an opening/closing valve are installed at the third inert gas supply pipe 232*g* in sequence from the upstream side. In addition, the above-mentioned third nozzle 249*c* is connected to a tip section of the third gas supply pipe 232*c*. The third nozzle 249*c* is installed in an arc-shaped space between the inner wall of the reaction tube 203 and the wafer 200 from the lower portion to the upper portion of the inner wall of the reaction tube 203 to stand up in the stacking direction of the wafers 200. That is, the third nozzle 249*c* is installed at the region horizontally surrounding the wafer arrangement region in which the wafers 200 are arranged, which is a side of the wafer arrangement region, along the wafer arrangement region. The third nozzle 249*c* is constituted by an L-shaped long nozzle, and has a horizontal section installed to pass through the lower sidewall of the reaction tube 203 and a vertical section installed to stand up at least from the one end side to the other end side of the wafer arrangement region. A gas supply hole 250*c* configured to supply a gas is formed in a side surface of the third nozzle 249*c*. The gas supply hole 250*c* is opened toward the center of the reaction tube 203 so that a gas may be supplied toward the wafer 200. The plurality of gas supply holes 250*c* are formed from the lower portion to the upper portion of the reaction tube 203, have the same opening area, and are installed at the same opening pitch.

A third gas supply system mainly includes the third gas supply pipe 232*c*, the mass flow controller 241*c*, and the valve 243*c*. The third nozzle 249*c* may be further included in the third gas supply system. Further, a fourth gas supply system mainly includes the fourth gas supply pipe 232*d*, the mass flow controller 241*d*, and the valve 243*d*. In addition, the third nozzle 249*c* disposed at a downstream side of a connecting section of the third gas supply pipe 232*c* with the fourth gas supply pipe 232*d* may be included in the fourth gas supply system. In addition, a third inert gas supply system mainly includes the third inert gas supply pipe 232*g*, the mass flow controller 241*g*, and the valve 243*g*. The third inert gas supply system also functions as a purge gas supply system.

As described above, in the method of supplying a gas according to the first embodiment, the gas is conveyed via the nozzles 249*a*, 249*b*, and 249*c* disposed in an arc-shaped longitudinal long space defined by the inner wall of the reaction tube 203 and the end section of the plurality of stacked wafers 200, the gas is firstly ejected into the reaction tube 203 near the wafer 200 through the gas supply holes 250*a*, 250*b*, and 250*c* opened at the nozzles 249*a*, 249*b* and 249*c*, respectively, and thus a main stream of the gas in the reaction tube 203 is in a direction parallel to the surface of the wafer 200, i.e., in a horizontal direction. According to the above-mentioned configuration, the gas may be evenly supplied to the wafer 200, and a film thickness of a thin film formed on the wafer 200 may be uniformized. In addition, while the gas flowing on the surface of the wafer 200, i.e., the gas remaining after reaction, flows in a direction of an exhaust port, i.e., the exhaust pipe 231 (to be described later), the direction in which the remaining gas flows is appropriately specified at a position of the exhaust port and not limited to the vertical direction.

A chlorosilane-based source gas that is a source gas containing a specific element and a halogen element, for example, a source gas containing at least silicon (Si) and chlorine (Cl), is supplied into the process chamber 201 via the mass flow controller 241*a*, the valve 243*a*, and the first nozzle 249*a* through the first gas supply pipe 232*a*. Here, the chlorosilane-based source gas means a chlorosilane-based source material in a gaseous state, for example, a gas obtained by evaporating a chlorosilane-based source material in a liquid state under a normal temperature and a normal pressure, or a chlorosilane-based source material in a gaseous state under a normal temperature and a normal pressure. In addition, the chlorosilane-based source material means a silane-based source material including a chloro group which is a halogen group, and a source material including at least silicon (Si) and chlorine (Cl). That is, here, the chlorosilane-based source material may refer to a type of halide. In addition, the term "source material" used in the present disclosure may refer to "a liquid source material in a liquid state," "a source gas in a gaseous state," or both of these. Accordingly, the term "chlorosilane-based source material" used in the present disclosure may refer to "a chlorosilane-based source material in a liquid state," "a chlorosilane-based source gas in a gaseous state," or both of these. For example, hexachlorodisilane ($Si_2Cl_6$, abbreviated to 'HCDS') gas may be used as the chlorosilane-based source gas. In addition, when the liquid source material in the liquid state is used under the normal temperature and normal pressure as the HCDS gas, the liquid source material is evaporated by an evaporation system, such as an evaporator, a bubbler, or the like, to be supplied as a source gas (HCDS gas).

For example, a gas containing an amine, i.e., an amine-based gas, which is a reactive gas (first reactive gas) containing carbon (C) and nitrogen (N), is supplied into the process chamber 201 via the mass flow controller 241*b*, the valve 243*b*, and the second nozzle 249*b* through the second gas supply pipe 232*b*. Here, the amine-based gas is an amine in a gaseous state, for example, a gas obtained by evaporating an amine in a liquid state under the normal temperature and normal pressure, or a gas containing an amine group such as amine in a gaseous state under the normal temperature and normal pressure. The amine-based gas includes an amine, such as ethylamine, methylamine, propylamine, isopropylamine, butylamine, isobutylamine, or the like. Here, "amine" is a general name of a compound in which a hydrogen atom of ammonia ($NH_3$) is substituted with a hydrocarbon group such as an alkyl group or the like. That is, the amine includes a hydrocarbon group such as an alkyl group or the like, which is a ligand including a carbon atom. The amine-based gas may refer to a gas containing no silicon because the gas includes three elements of carbon (C), nitrogen (N), and hydrogen (H) but does not include silicon (Si), and may refer to a gas containing no silicon and no metal because the gas does not include silicon or a metal. In addition, the amine-based gas may be a nitrogen-containing gas, a carbon-containing gas, or a hydrogen-containing gas. The amine-based gas may be a gas containing only three elements of carbon (C), nitrogen (N), and hydrogen (H) constituting the amine group. In addition, the term "amine" used in the present disclosure may mean "an amine in a liquid state," "an amine-based gas in a gaseous state," or both of these. For example, triethylamine [$(C_2H_5)_3N$, abbreviated to TEA] gas may be used as the amine-based gas. In addition, when an amine such as TEA that is in a liquid state under a normal temperature and normal pressure is used, the amine in the liquid state is evaporated by an evaporation system, such as an evaporator, a bubbler, or the like, to be supplied as a first reactive gas (TEA gas).

For example, a gas including oxygen (O) (oxygen-containing gas), i.e., an oxidizing gas (oxidant gas), which is a reactive gas that is different from the first reactive gas (second reactive gas), is supplied into the process chamber 201 via the mass flow controller 241*c*, the valve 243*c*, and the third nozzle 249*c* through the third gas supply pipe 232*c*. For example, oxygen ($O_2$) gas may be used as the oxygen-containing gas.

For example, a gas including nitrogen (N) (nitrogen-containing gas), i.e., a nitriding gas (nitridant gas), which is a reactive gas that is different from the first reactive gas (second reactive gas), is supplied into the process chamber 201 via the mass flow controller 241*d*, the valve 243*d*, the third gas supply pipe 232*c*, and the third nozzle 249*c* through the fourth gas supply pipe 232*d*. For example, ammonia ($NH_3$) gas may be used as the nitrogen-containing gas.

For example, nitrogen ($N_2$) gas, which is an inert gas, is supplied into the process chamber 201 via the mass flow controllers 241*e*, 241*f*, and 241*g*, the valves 243*e*, 243*f*, and 243*g*, the gas supply pipes 232*a*, 232*b*, and 232*c*, and the nozzles 249*a*, 249*b*, and 249*c* through the inert gas supply pipes 232*e*, 232*f*, and 232*g*.

In addition, for example, when the above-mentioned gases flow through the respective gas supply pipes, a source gas supply system configured to supply a source gas including a specific element and a halogen group, i.e., a chlorosilane-based source gas supply system, is constituted by the first gas supply system. Further, the chlorosilane-based source gas supply system is also referred to simply as a chlorosilane-based source material supply system. Furthermore, a reactive gas supply system (first reactive gas supply system), i.e., an amine-based gas supply system, is constituted by the second gas supply system. In addition, the amine-based gas supply system is also referred to simply as an amine supply system. Further, a reactive gas supply system (second reactive gas supply system), i.e., an oxygen-containing gas supply system serving as an oxidizing gas supply system, is constituted by the third gas supply system. Furthermore, a reactive gas supply system (second reactive gas supply system), i.e., a nitrogen-containing gas supply system serving as a nitriding gas supply system, is constituted by the fourth gas supply system.

The exhaust pipe 231 configured to exhaust an atmosphere in the process chamber 201 is installed in the reaction tube 203. When seen in a transverse cross-sectional view as shown in FIG. 2, the exhaust pipe 231 is installed at a side of the reaction tube 203 opposite to a side in which the gas supply hole 250*a* of the first nozzle 249*a*, the gas supply hole 250*b* of the second nozzle 249*b*, and the gas supply hole 250*c* of the third nozzle 249*c* are formed, i.e., an opposite side of the gas supply holes 250*a*, 250*b*, and 250*c* via the wafer 200. In addition, when seen in a longitudinal cross-sectional view as shown in FIG. 1, the exhaust pipe 231 is installed under a place in which the gas supply holes 250*a*, 250*b*, and 250*c* are formed. According to the configuration, the gas supplied in the vicinity of the wafer 200 in the process chamber 201 through the gas supply holes 250*a*, 250*b*, and 250*c* flows in a horizontal direction, i.e., in a direction parallel to the surface of the wafer 200, then flows downward, and then is exhausted through the exhaust pipe 231. A main flow of the gas in the process chamber 201 becomes a flow in the horizontal direction as described above.

A vacuum pump 246 serving as a vacuum exhaust apparatus is connected to the exhaust pipe 231 via a pressure sensor 245 serving as a pressure detector (pressure detection unit) configured to detect the pressure in the process chamber 201 and an APC (Auto Pressure Controller) valve 244 serving as a pressure regulator (pressure regulation unit) which is an exhaust valve. In addition, the APC valve 244 is a valve configured to perform the vacuum exhaust of the inside of the process chamber 201 and stop the vacuum exhaust by opening/closing the valve in a state in which the vacuum pump 246 is operated, and configured to regulate the pressure in the process chamber 201 by adjusting a valve opening angle in a state in which the vacuum pump 246 is operated. An exhaust system, i.e., an exhaust line, mainly includes the exhaust pipe 231, the APC valve 244, and the pressure sensor 245. The vacuum pump 246 may further be included in the exhaust system (exhaust line). The exhaust system (exhaust line) is configured to perform the vacuum exhaust such that the pressure in the process chamber 201 arrives at a predetermined pressure (vacuum level) by adjusting the valve opening angle of the APC valve 244 based on the pressure information detected by the pressure sensor 245 while operating the vacuum pump 246.

A seal cap 219 serving as a furnace port cover configured to hermetically seal the lower end opening of the reaction tube 203 is installed under the reaction tube 203. The seal cap 219 is configured to abut the lower end of the reaction tube 203 from a lower side in the vertical direction. The seal cap 219 is formed of a metal such as stainless steel or the like, and has a disc shape. An O-ring 220 serving as a seal member configured to abut the lower end of the reaction tube 203 is installed at an upper surface of the seal cap 219. A rotary mechanism 267 configured to rotate the boat 217 serving as a substrate holder (to be described later) is installed at a side of the seal cap 219 opposite to the process chamber 201. A rotary shaft 255 of the rotary mechanism 267 is connected to the boat 217 through the seal cap 219. The rotary mechanism 267 is configured to rotate the boat 217 to rotate the wafer 200. The seal cap 219 is constituted to be raised and lowered in the vertical direction by a boat elevator 115 serving as a raising/lowering mechanism vertically installed at the outside of the reaction tube 203. The boat elevator 115 is configured to load and unload the boat 217 into and from the process chamber 201 by raising and lowering the seal cap 219. That is, the boat elevator 115 is constituted by a conveyance apparatus (conveyance mechanism) configured to convey the boat 217, i.e., the wafer 200, to/from the process chamber 201.

The boat 217 serving as a substrate support member is formed of a heat resistant material, such as quartz, silicon carbide, or the like, and configured to concentrically align the plurality of wafers 200 in a horizontal posture and support the wafers 200 in a multi-stage. In addition, an insulating member 218 formed of a heat resistant material, such as quartz, silicon carbide, or the like, is installed under the boat 217 so that heat from the heater 207 cannot be easily transferred toward the seal cap 219. Further, the insulating member 218 may be constituted by a plurality of insulating plates formed of a heat resistant material, such as quartz, silicon carbide, or the like, and an insulating plate holder configured to support the insulating plate in a horizontal posture in a multi-stage.

A temperature sensor 263 serving as a temperature detector is installed in the reaction tube 203, and an electrical connection state to the heater 207 is adjusted based on the temperature information detected by the temperature sensor 263 so that the temperature in the process chamber 201 may have a desired temperature distribution. The temperature sensor 263 has an L shape similar to the nozzles 249*a*, 249*b*, and 249*c*, and is installed along the inner wall of the reaction tube 203.

Figure 3:
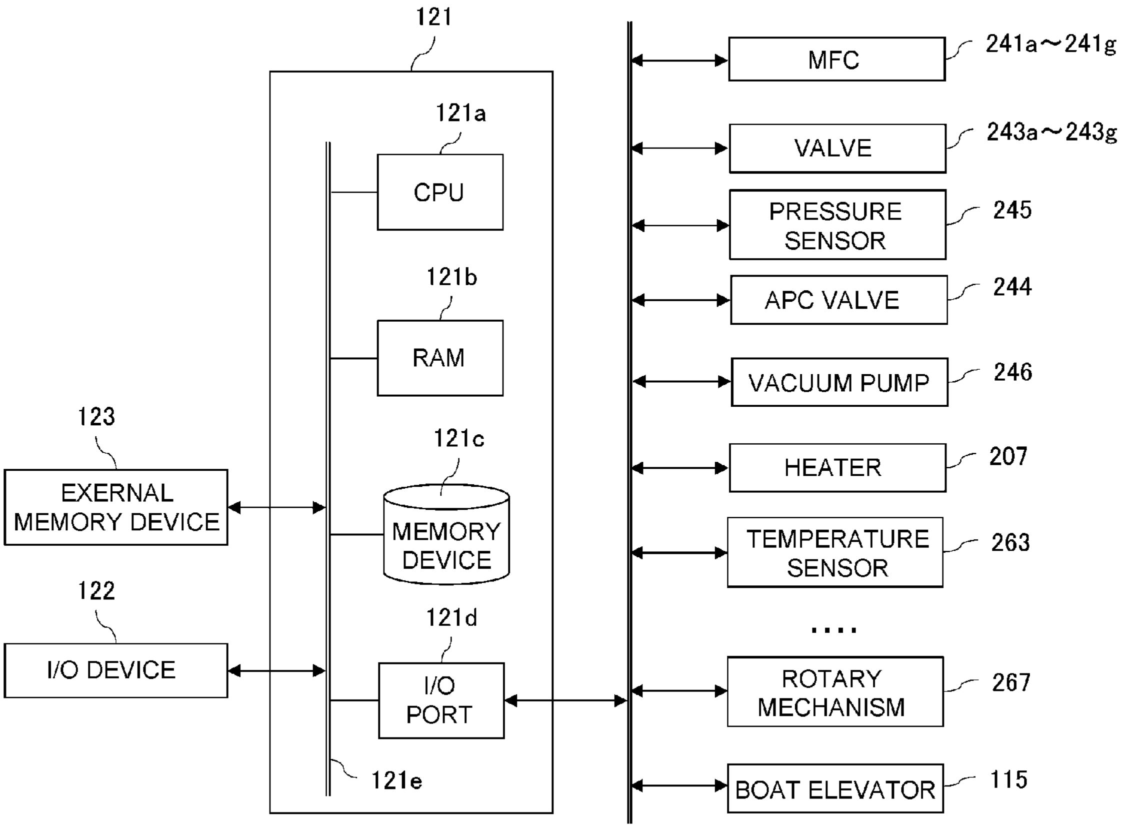
FIG. 3 is a schematic configuration view of a controller of the substrate processing apparatus according to an exemplarily embodiment of the present invention, showing a control system of the controller in a block diagram.

As shown in FIG. 3, a controller 121 serving as a control unit (control unit) is constituted by a computer including a central processing unit (CPU) 121*a*, a random access memory (RAM) 121*b*, a memory device 121*c*, and an input/output (I/O) port 121*d*. The RAM 121*b*, the memory device 121*c* and the I/O port 121*d* are configured to exchange data with the CPU 121*a* via an internal bus 121*e*. An input/output (I/O) device 122 constituted by, for example, a touch panel or the like, is connected to the controller 121.

The memory device 121*c* is constituted by, for example, a flash memory, a hard disk drive (HDD), or the like. A control program configured to control an operation of a substrate processing apparatus or a process recipe in which a sequence or conditions of substrate processing (to be described later) is readably stored in the memory device 121*c*. In addition, the process recipe is provided by assembling sequences in a substrate processing process (to be described below) to be performed in the controller 121 to obtain a predetermined result, and functions as a program. Hereinafter, the process recipe or the control program is generally and simply referred to as a program. In addition, the term "program" used in the present disclosure may include only the process recipe, only the control program, or both of these. Further, the RAM 121*b* is constituted by a memory region (work area) in which a program or data read by the CPU 121*a* is temporarily stored.

The I/O port 121*d* is connected to the above-mentioned mass flow controllers 241*a*, 241*b*, 241*c*, 241*d*, 241*e*, 241*f*, and 241*g*, the valves 243*a*, 243*b*, 243*c*, 243*d*, 243*e*, 243*f*, and 243*g*, the pressure sensor 245, the APC valve 244, the vacuum pump 246, the heater 207, the temperature sensor 263, the rotary mechanism 267, the boat elevator 115, etc.

The CPU 121*a* is configured to read and execute the control program from the memory device 121*c*, and to read the process recipe from the memory device 121*c*, according to an operation command input via the input/output device 122. In addition, the CPU 121*a* is configured to control a flow rate control operation of various gases by the mass flow controllers 241*a*, 241*b*, 241*c*, 241*d*, 241*e*, 241*f*, and 241*g*, an opening/closing operation of the valves 243*a*, 243*b*, 243*c*, 243*d*, 243*e*, 243*f*, and 243*g*, an opening/closing operation of the APC valve 244, a pressure regulation operation by the APC valve 244 based on the pressure sensor 245, a temperature control operation of the heater 207 based on the temperature sensor 263, start and stoppage of the vacuum pump 246, a rotation and rotational speed control operation of the boat 217 by the rotary mechanism 267, a raising/lowering operation of the boat 217 by the boat elevator 115, etc., according to contents of the read process recipe.

In addition, the controller 121 is not limited to being constituted by an exclusive computer, and may be constituted by a general computer. For example, the controller 121 according to the first embodiment may be constituted by preparing an external memory device 123 in which the above-mentioned program is stored (for example, a magnetic tape, a magnetic disk such as a flexible disk, a hard disk, or the like, an optical disc such as a CD, a DVD, or the like, an optical magnetic disc such as MO, or a semiconductor memory such as a USB memory, a memory card, or the like), and installing the program in the general computer using the above-mentioned external memory device 123. Further, a unit configured to supply a program to the computer is not limited to the case in which the program is supplied via the external memory device 123. For example, the program may be supplied using a communication unit, such as the Internet or an exclusive line, without the external memory device 123. In addition, the memory device 121*c* or the external memory device 123 is constituted by a non-transitory computer-readable recording medium. Hereinafter, these are generally and simply referred to as non-transitory computer-readable recording media. Further, the term "non-transitory computer-readable recording medium" used in the present disclosure may include only the memory device 121*c*, only the external memory device 123, or both of these.

(2) Substrate Processing Process

Next, a method of forming a thin film on the wafer 200 using the processing furnace 202 of the substrate processing apparatus as described above will be described. In the following description, operations of the respective parts constituting the substrate processing apparatus are controlled by the controller 121.

According to the first embodiment, a thin film is formed on the wafer 200 in the process chamber 201 by performing a cycle a predetermined number of times (once or more), the cycle including a process of supplying a source gas to the wafer 200 and a process of supplying a reactive gas to the wafer 200.

During at least one process among the process of supplying the source gas and the process of supplying the reactive gas, a first supply process of supplying the source gas or the reactive gas used in the at least one process at a first flow rate is performed while exhausting of an atmosphere in the process chamber 201 is suspended until pressure in the process chamber 201 reaches a predetermined pressure; and a second supply process of supplying the source gas or the reactive gas used in the at least one process at a second flow rate, which is less than the first flow rate, is performed in a state in which the atmosphere in the process chamber 201 is exhausted while maintaining the predetermined pressure in the process chamber 201, after the pressure in the process chamber 201 reaches the predetermined pressure.

Further, in the first embodiment, conditions of supplying a plurality of types of gases including a plurality of elements forming the thin film are controlled such that a composition ratio of the thin film has a stoichiometric composition or a predetermined composition ratio different from the stoichiometric composition. For example, the supply conditions are controlled such that at least one element among the plurality of elements forming the thin film is more excessive than the other elements, with respect to the stoichiometric composition. Hereinafter, an example in which the film-forming is performed while controlling a ratio of the plurality of elements forming the thin film, i.e., a composition ratio of the thin film, will be described.

Figure 4:
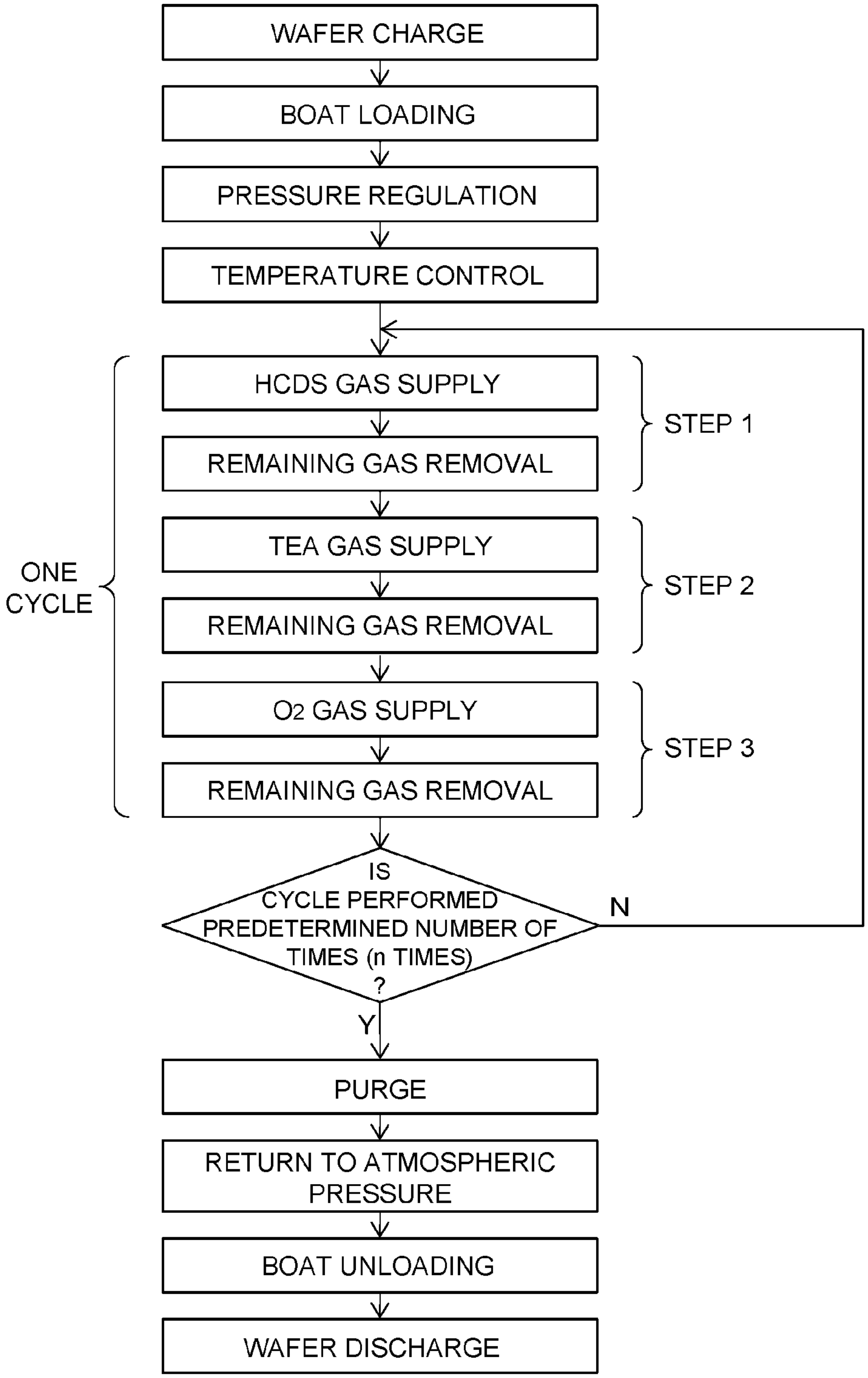
FIG. 4 is a view showing a film-forming flow according to a first embodiment of the present invention.
Figure 5:
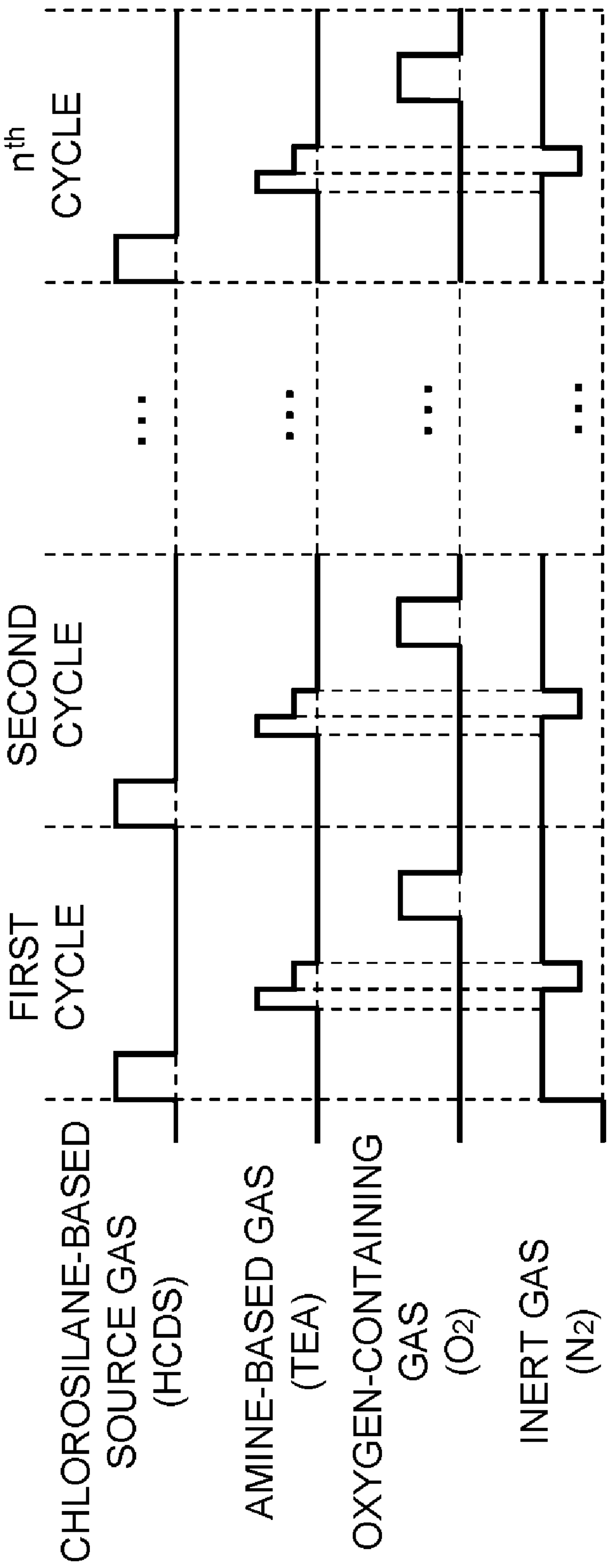
FIG. 5 is a view showing gas supply timing in a film-forming sequence according to the first embodiment of the present invention.

A film-forming sequence according to the first embodiment will now be described with reference to FIGS. 4 and 5 in detail. FIG. 4 is a view showing a film-forming flow according to the first embodiment. FIG. 5 is a view showing gas supply timing in the film-forming sequence according to the first embodiment.

In addition, here, an example of a process of forming a silicon oxycarbonitride (SiOCN) film or a silicon oxycarbide (SiOC) film, which is a silicon-based insulating film having a predetermined composition and a predetermined thickness on the wafer 200 by performing a cycle a predetermined number of times (n times), the cycle including: a process of forming a silicon-containing layer containing chlorine on the wafer 200 in the process chamber 201 by supplying HCDS gas (which is a chlorosilane-based source gas) as a source gas to the wafer 200 in the process chamber 201, a process of forming a first layer containing silicon, nitrogen, and carbon on the wafer 200 by modifying the silicon-containing layer containing chlorine by supplying TEA gas (which is an amine-based gas) as a first reactive gas, and a process of forming a SiOCN film or a SiOC film as a second layer by modifying the first layer by supplying $O_2$ gas (oxygen-containing gas) as a second reactive gas (which is different from the source gas and the first reactive gas) on the wafer 200 in the process chamber 201, will be described.

In addition, here, in a process of supplying the TEA gas among three processes, i.e., the process of supplying the HCDS gas, the process of supplying TEA gas, and a process of supplying $O_2$ gas, a first supply process of supplying the TEA gas at a first flow rate in a state in which exhausting an atmosphere in the process chamber 201 is suspended until the pressure in the process chamber 201 reaches a predetermined pressure (hereinafter referred to as 'first TEA gas supply process'); and a second supply process of supplying the TEA gas at a second flow rate which is less than the first flow rate in a state in which the atmosphere in the process chamber 201 is exhausted while maintaining the predetermined pressure in the process chamber 201, after the pressure in the process chamber 201 reaches the predetermined pressure (hereinafter referred to as 'second TEA gas supply process') will be described.

The term "wafer" used in the present disclosure may mean only "the wafer itself," or "a stacked structure (assembly) of the wafer and a layer or film formed on a surface thereof, i.e., the wafer including the layer or film formed on the surface thereof." In addition, the term "a surface of a wafer" used in the present disclosure may mean "an (exposed) surface of the wafer itself," or "a surface of the layer or film formed on the wafer, i.e., an outermost surface of the wafer, which is a stacked structure.

Accordingly, an expression "predetermined gas is supplied to a wafer" in the present disclosure may mean "predetermined gas is directly supplied to an (exposed) surface of the wafer itself," or "predetermined gas is supplied to a layer or film formed on the wafer, i.e., the outermost surface of the wafer, which is a stacked structure." In addition, an expression "predetermined layer (or film) is formed on a wafer" in the present disclosure may mean "predetermined layer (or film) is directly formed on an (exposed) surface of the wafer itself," or "predetermined layer (or film) is formed on a layer or film formed on the wafer, i.e., the outermost surface of the wafer, which is a stacked structure."

In addition, the term "substrate" used in the present disclosure is similar to the term "wafer," and thus "wafer" and "substrate" may be used synonymously in the present disclosure.

Wafer Charging and Boat Loading

When a plurality of wafers 200 are loaded in the boat 217 (wafer charging), the boat 217 supporting the plurality of wafers 200 is raised by the boat elevator 115 to be loaded into the process chamber 201 (boat loading), as illustrated in FIG. 1. In this state, the seal cap 219 seals the lower end of the reaction tube 203 via the O-ring 220.

Pressure Regulation and Temperature Control

The inside of the process chamber 201 is vacuum-exhausted to a predetermined pressure (vacuum level) by the vacuum pump 246. In this case, the pressure in the process chamber 201 is measured by the pressure sensor 245, and the APC valve 244 is feedback-controlled based on the measured pressure information (pressure regulation). In addition, the vacuum pump 246 maintains an always-operating state at least until the processing of the wafer 200 is terminated. Further, the inside of the process chamber 201 is heated to a desired temperature by the heater 207. In this case, an electrical connection state to the heater 207 is feedback-controlled based on the temperature information detected by the temperature sensor 263 such that the inside of the process chamber 201 has a desired temperature distribution (temperature control). In addition, the heating of the inside of the process chamber 201 by the heater 207 is continuously performed at least until the processing of the wafer 200 is terminated. Next, rotation of the boat 217 and the wafer 200 is started by the rotary mechanism 267. The rotation of the boat 217 and the wafer 200 by the rotary mechanism 267 is continuously performed at least until the processing of the wafer 200 is terminated.

Process of Forming Silicon Oxycarbonitride Film or Silicon Oxycarbide Film

Next, the following three steps, i.e., steps 1 to 3, are sequentially performed.

Step 1

HCDS Gas Supply

The valve 243*a* of the first gas supply pipe 232*a* is opened to cause HCDS gas to flow through the first gas supply pipe 232*a*. The flow rate of the HCDS gas flowing through the first gas supply pipe 232*a* is controlled by the mass flow controller 241*a*. The flow-rate-controlled HCDS gas is supplied into the process chamber 201 through the gas supply hole 250*a* of the first nozzle 249*a* to be exhausted through the exhaust pipe 231. Here, the HCDS gas is supplied to the wafer 200. Here, simultaneously, the valve 243*e* is opened to cause $N_2$ gas, which is an inert gas, to flow through the first inert gas supply pipe 232*e*. The flow rate of the $N_2$ gas flowing through the first inert gas supply pipe 232*e* is controlled by the mass flow controller 241*e*. The flow-rate-controlled $N_2$ gas is supplied into the process chamber 201 to be exhausted through the exhaust pipe 231 with the HCDS gas.

In addition, here, in order to prevent invasion of HCDS gas into the second nozzle 249_b_ and the third nozzle 249_c_, the valves 243_f_, and 243_g_ are opened to cause the $N_2$ gas to flow through the second inert gas supply pipe 232_f_ and the third inert gas supply pipe 232_g_. The $N_2$ gas is supplied into the process chamber 201 to be exhausted through the exhaust pipe 231 via the second gas supply pipe 232_b_, the third gas supply pipe 232_c_, the second nozzle 249_b_, and the third nozzle 249_c_.

Here, the APC valve 244 is appropriately adjusted such that the pressure in the process chamber 201 is within a range of, for example, 1 to 13,300 Pa, and preferably 20 to 1,330 Pa. A supply flow rate of the HCDS gas controlled by the mass flow controller 241_a_ is a flow rate within a range of, for example, 1 to 1,000 sccm. Each supply flow rate of the $N_2$ gas controlled by the mass flow controllers 241_e_, 241_f_, and 241_g_ is a flow rate within a range of, for example, 100 to 10,000 sccm. A time in which the HCDS gas is supplied to the wafer 200, i.e., a gas supply time (exposure time), is a time within a range of, for example, 1 to 120 seconds, and preferably 1 to 60 seconds. Here, a temperature of the heater 207 is set such that the temperature of the wafer 200 is a temperature within a range of, for example, 250 to 700° C., preferably 300 to 650° C., and more preferably 350 to 600° C. In addition, when the temperature of the wafer 200 is less than 250° C., a practical film-forming speed may not be accomplished because the HCDS cannot be easily chemisorbed onto the wafer 200. This problem may be solved by increasing the temperature of the wafer to 200 to 250° C. or more. Further, when the temperature of the wafer 200 is set to 300° C. or more, or 350° C. or more, the HCDS may be more sufficiently absorbed onto the wafer 200, and a more sufficient film-forming speed can be accomplished. In addition, when the temperature of the wafer 200 exceeds 700° C., the CVD reaction is strengthened (a gas phase reaction becomes dominant), and thus film thickness uniformity is likely to be degraded, making it difficult to control the film thickness uniformity. When the temperature of the wafer 200 is set to 700° C. or less, degradation of the film thickness uniformity can be suppressed to enable the control thereof. In particular, when the temperature of the wafer 200 is 650° C. or less, or 600° C. or less, the surface reaction becomes dominant, and the film thickness uniformity can be easily accomplished to enable easy control thereof. Accordingly, the temperature of the wafer 200 may be a temperature within a range of 250 to 700° C., preferably 300 to 650° C., and more preferably 350 to 600° C.

A silicon-containing layer including chlorine (Cl) and having a thickness of, for example, less than one atomic layer to several atomic layers is formed on the wafer 200 (a base film on a surface of the wafer 200) as a seed layer including a specific element (silicon) and a halogen element (chlorine) by supplying the HCDS gas to the wafer 200 under the above-mentioned conditions. A silicon-containing layer including Cl may include an adsorption layer of the HCDS gas, a silicon (Si) layer including Cl, or both of these.

Here, the silicon layer including Cl is a general name including a continuous layer composed of silicon (Si) and including Cl, a discontinuous layer, and a silicon thin film formed by overlapping them and including Cl. In addition, the continuous layer composed of Si and including Cl may refer to a silicon thin film including Cl. Further, Si forming the silicon layer including Cl may include Cl bonds that are completely broken, in addition to Cl bonds that are not completely broken.

The adsorption layer of the HCDS gas also includes a discontinuous chemical adsorption layer in addition to the continuous chemical adsorption layer of gas molecules of HCDS gas. That is, the adsorption layer of the HCDS gas includes a chemical adsorption layer composed of HCDS molecules and having a thickness of one molecular layer or less than one molecular layer. In addition, HCDS ($Si_2Cl_6$) molecules forming the adsorption layer of the HCDS gas may also include the Si and Cl bonds that are partially broken, i.e., $Si_xCl_y$ molecules. That is, the adsorption layer of the HCDS gas includes a continuous chemical adsorption layer or a discontinuous chemical adsorption layer of $Si_2Cl_6$ molecules and/or $Si_xCl_y$ molecules.

In addition, the layer having a thickness of less than one atomic layer is an atomic layer that is discontinuously formed, and the layer having a thickness of one atomic layer is an atomic layer that is continuously formed. Further, the layer having a thickness of less than one molecular layer is a molecular layer that is discontinuously formed, and the layer having a thickness of one molecular layer is a molecular layer that is continuously formed.

Si is deposited on the wafer 200 to form the silicon layer including Cl under the conditions in which the HCDS gas is autolyzed (pyrolyzed), i.e., the conditions in which a pyrolysis reaction of the HCDS is generated. The HCDS gas is adsorbed onto the wafer 200 to form the adsorption layer of the HCDS gas under the conditions in which the HCDS gas is not autolyzed (pyrolyzed), i.e., the conditions in which a pyrolysis reaction of the HCDS is not generated. In addition, a film-forming rate may be higher when the silicon layer including Cl is formed on the wafer 200 than when the adsorption layer of the HCDS gas is formed on the wafer 200.

When the thickness of the silicon-containing layer including Cl formed on the wafer 200 exceeds several atomic layers, an effect of modification in the following step 2 and step 3 is not delivered to the entire silicon-containing layer including Cl. In addition, a minimum value of the thickness of the silicon-containing layer including Cl to be formed on the wafer 200 is less than one atomic layer. Accordingly, the thickness of the silicon-containing layer including Cl may be less than one atomic layer to about several atomic layers. Further, when the thickness of the silicon-containing layer including Cl is one atomic layer or less, i.e., one atomic layer or less than one atomic layer, the effect of the modification reaction in the following step 2 and step 3 can be relatively improved, and a time needed for the modification reaction in steps 2 and 3 can be reduced. A time needed to form the silicon-containing layer including Cl in step 1 can also be reduced. Eventually, a processing time per cycle can be reduced, thereby reducing a total processing time. That is, the film-forming rate can also be increased. In addition, when the thickness of the silicon-containing layer including Cl is one atomic layer or less, controllability of the film thickness uniformity can also be increased.

Remaining Gas Removal

After the silicon-containing layer including Cl is formed as a seed layer, the valve 243_a_ of the first gas supply pipe 232_a_ is closed to stop supply of the HCDS gas. Here, the inside of the process chamber 201 is vacuum-exhausted by the vacuum pump 246 in a state in which the APC valve 244 of the exhaust pipe 231 is open (preferably, in a state in which the APC valve 244 is fully open), and the HCDS gas after non-reaction or contribution to formation of the seed layer and remaining in the process chamber 201 is removed from the inside of the process chamber 201. In this case, supply of the $N_2$ gas, which is an inert gas, into the process chamber 201 is maintained in a state in which the valves 243_e_, 243_f_, and 243_g_ are open. The $N_2$ gas serves as a purge gas, and thus an effect of removing the HCDS gas after non-reaction or contribution to formation of the seed layer and remaining in the process chamber 201 from the inside of the process chamber 201 can be increased.

In addition, here, the gas remaining in the process chamber 201 may not be completely removed, and the inside of the process chamber 201 may not be completely purged. When the gas remaining in the process chamber 201 is minute, there is no bad influence on step 2 performed thereafter. Here, a flow rate of the $N_2$ gas supplied into the process chamber 201 need not be a large flow rate, and for example, an amount of $N_2$ gas substantially equal to a capacity of the reaction tube 203 (the process chamber 201) may be supplied to perform the purge such that no bad influence is generated in step 2. As described above, as the inside of the process chamber 201 is not completely purged, the purge time can be reduced to improve throughput. In addition, consumption of the $N_2$ gas can be suppressed to a necessary minimum value.

In addition to hexachlorodisilane ($Si_2Cl_6$, abbreviated to HCDS) gas, an inorganic source gas such as tetrachlorosilane, i.e., silicontetrachloride ($SiCl_4$, abbreviated to STC) gas, trichlorosilane ($SiHCl_3$, abbreviated to TCS) gas, dichlorosilane ($SiH_2Cl_2$, abbreviated to DCS) gas, monochlorosilane ($SiH_3Cl$, abbreviated to MCS) gas, or the like, may be used as the chlorosilane-based source gas. In addition to the $N_2$ gas, a rare gas such as Ar gas, He gas, Ne gas, Xe gas, or the like may be used as the inert gas.

Step 2

TEA Gas Supply

After step 1 is terminated and the remaining gas in the process chamber 201 is removed, the valve 243*b* of the second gas supply pipe 232*b* is opened to cause the TEA gas to flow through the second gas supply pipe 232*b*. The flow rate of the TEA gas flowing through the second gas supply pipe 232*b* is controlled by the mass flow controller 241*b*. The flow-rate-controlled TEA gas is supplied into the process chamber 201 through the gas supply hole 250*b* of the second nozzle 249*b*. The TEA gas supplied into the process chamber 201 is thermally activated (excited) to be exhausted through the exhaust pipe 231. Here, the thermally activated TEA gas is supplied to the wafer 200. Simultaneously, the valve 243*f* is opened to cause the $N_2$ gas, which is an inert gas, to flow through the second inert gas supply pipe 232*f*. The flow rate of the $N_2$ gas flowing through the second inert gas supply pipe 232*f* is controlled by the mass flow controller 241*f*. The flow-rate-controlled $N_2$ gas is supplied into the process chamber 201 to be exhausted through the exhaust pipe 231, together with the TEA gas.

In addition, here, in order to prevent invasion of the TEA gas into the first nozzle 249*a* and the third nozzle 249*c*, the valves 243*e* and 243*g* are opened to cause the $N_2$ gas to flow through the first inert gas supply pipe 232*e* and the third inert gas supply pipe 232*g*. The $N_2$ gas is supplied into the process chamber 201 via the first gas supply pipe 232*a*, the third gas supply pipe 232*c*, the first nozzle 249*a* and the third nozzle 249*c*, and is exhausted through the exhaust pipe 231.

The TEA gas can be supplied to the wafer 200 to react the silicon-containing layer including Cl, which is a seed layer formed on the wafer 200 in step 1, under the above-mentioned conditions. That is, atoms (Cl atoms) of a halogen element included in the silicon-containing layer including Cl, which is a seed layer, can be reacted with ligands (ethyl groups) included in the TEA gas. Accordingly, as at least some Cl included in the seed layer is drawn (separated) from the seed layer, and simultaneously, at least some ethyl groups of the plurality of ethyl groups included in the TEA gas can be separated from the TEA gas. Then, N of the TEA gas from which at least some ethyl groups are separated can be bonded to Si included in the seed layer. That is, N forming the TEA gas, from which at least some ethyl groups are separated, and including dangling bonds, can be bonded to Si included in the seed layer including dangling bonds, or Si that includes the dangling bonds, forming Si—N bonds. In addition, here, C included in the ethyl group ($—CH_2CH_3$) separated from the TEA gas can be bonded to Si included in the seed layer, thereby forming Si—C bonds. As a result, Cl is desorbed from the seed layer, and a N component is newly introduced into the seed layer. In addition, here, a C component is also newly introduced into the seed layer.

Since the TEA gas can be supplied to appropriately react the silicon-containing layer including Cl, which is a seed layer, with the TEA gas under the above-mentioned conditions, the series of reactions described above can be generated.

The N component and the C component are newly introduced into the seed layer while Cl is desorbed from the seed layer by the series of reactions, and the silicon-containing layer including Cl, which is a seed layer, is changed (modified) into the first layer including silicon (Si), nitrogen (N) and carbon (C), i.e., the silicon carbonitride (SiCN) layer. The first layer becomes a layer including Si, N and C and having a thickness of less than one atomic layer to several atomic layers. In addition, the first layer becomes a layer having a relatively high ratio of a Si component and a C component, i.e., a Si-rich or C-rich layer.

In addition, when a layer including Si, N, and C is formed as the first layer, chlorine (Cl) included in the silicon-containing layer including Cl and hydrogen (H) included in the TEA gas composes a gaseous material, such as chlorine ($Cl_2$) gas, hydrogen ($H_2$) gas, or hydrogen chloride (HCl) gas, and is discharged from the inside of the process chamber 201 via the exhaust pipe 231 during a modification reaction of the silicon-containing layer including Cl by the TEA gas. That is, impurities, such as Cl or the like, in the seed layer are drawn or desorbed from the seed layer to be separated from the seed layer. Accordingly, the first layer becomes a layer having a smaller amount of impurities such as Cl or the like than the seed layer.

Figure 8:
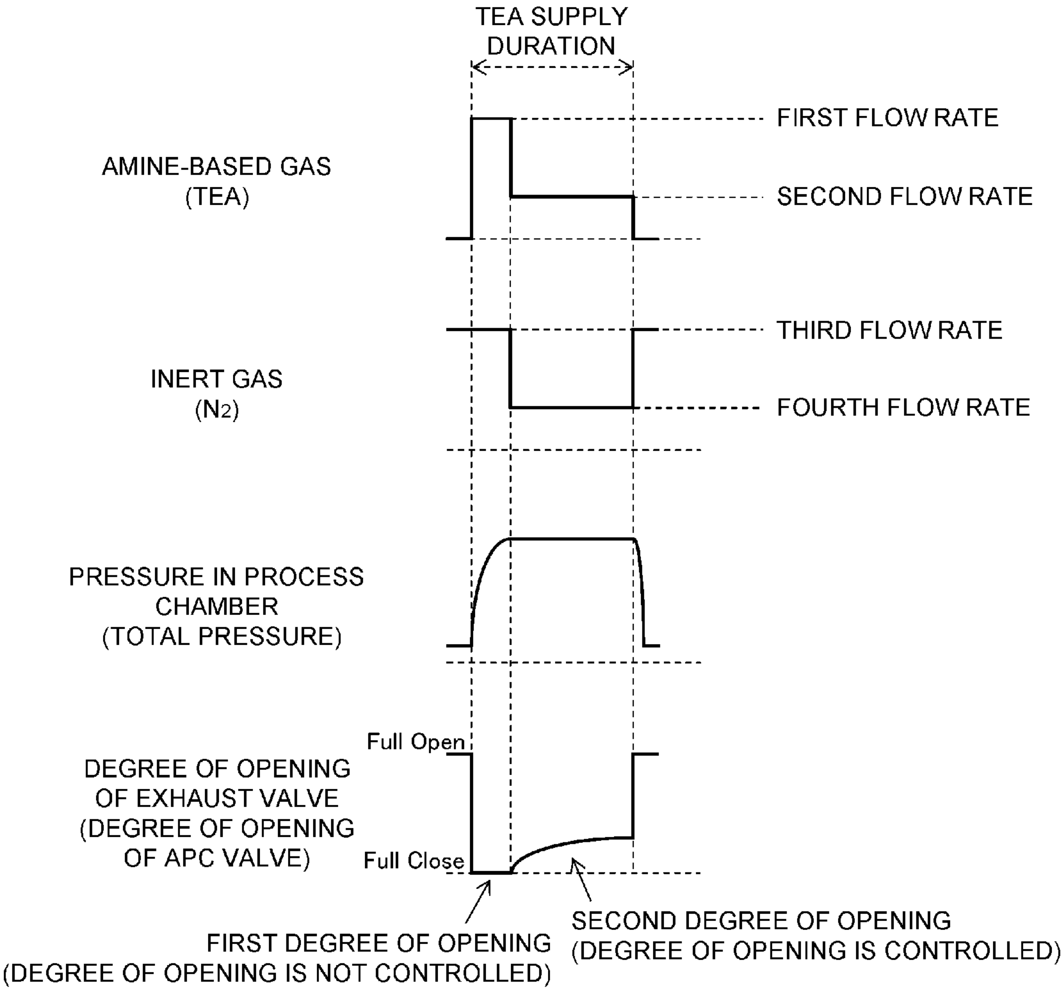
FIG. 8 is a diagram illustrating the relationship among a flow rate of a reactive gas (TEA), a flow rate of an inert gas ($N_2$), pressure in a process chamber, a degree of opening of an exhaust valve (APC valve) during a reactive gas (TEA) supply process included in a film-forming sequence according to an embodiment of the present invention.

In addition, in step 2, the flow rate of the TEA gas, the flow rate of the $N_2$ gas, and the pressure in the process chamber 201 are controlled by the mass flow controller 241*b*, the mass flow controller 241*f*, and the APC valve 244 as illustrated in FIG. 8. FIG. 8 illustrates the relationship among the flow rate of the reactive gas (TEA gas), the flow rate of the inert gas ($N_2$ gas), the pressure in the process chamber 201, and the degree of opening of the exhaust valve (APC valve) in step 2, i.e., the process of the reactive gas (TEA gas).

When the TEA gas is supplied in step 2, first, the TEA gas is supplied at the first flow rate (first TEA gas supply process). Then, after the pressure in the process chamber 201 reaches a predetermined pressure, the TEA gas is supplied at the second flow rate that is less than the first flow rate while maintaining the pressure in the process chamber 201 (second TEA gas supply process). In other words, in step 2, during the supply of the TEA gas, the TEA gas is initially supplied at a comparatively high flow rate, and the flow rate of the TEA gas is lowered after a predetermined time and in a stable state in which the pressure in the process chamber 201 reaches a predetermined pressure, while maintaining the predetermined pressure in the process chamber 201. In this case, in step 2, a total supply rate of the TEA gas into the process chamber 201, i.e., a consumption rate of the TEA gas, may be lowered more than when the TEA gas is supplied at the first flow rate into the process chamber 201.

In addition, the degree of opening of the APC valve 244 installed at an exhaust line configured to exhaust the inside of the process chamber 201 may be set to a first degree of opening when the TEA gas is supplied at the first flow rate, and may be set to be a second degree of opening (which is greater (wider) than the first degree of opening) when the TEA gas is supplied at the second flow rate. That is, an exhaust conductance at an exhaust line configured to exhaust the inside of the process chamber 201 may be set to be a first exhaust conductance, and when the TEA gas is supplied at the second flow rate, may be set to be a second exhaust conductance that is greater than the first exhaust conductance when the TEA gas is supplied at the first flow rate. In other words, when the TEA gas is supplied at the first flow rate, the degree of opening of the APC valve 244 may be set to be the first degree of opening that is less (narrower) than the second degree of opening and the exhaust conductance may be set to be the first exhaust conductance that is less than the second exhaust conductance. In this case, when the TEA gas is supplied at the first flow rate, a total flow rate of gases supplied into the process chamber 201 (i.e., the sum of the flow rate of the TEA gas and the flow rate of the $N_2$ gas) may be greater than an exhaust flow rate of a gas exhausted via the exhaust line. In this case, the pressure in the process chamber 201 may be rapidly raised and may thus be regulated to a predetermined pressure within a short time period. That is, a time needed to regulate the process chamber 201 to the predetermined pressure may be shortened. In addition, since the pressure in the process chamber 201 may be rapidly raised to a comparatively high pressure, the amount of carbon (C) present in the process chamber 201 may be increased, the amount of carbon (C) added to the first layer may be increased, and the concentration of carbon (C) contained in the first layer may be increased. The second degree of opening means a degree of opening that allows the pressure in the process chamber 201 to be maintained at a predetermined level and that is automatically adjusted by the controller 121 as illustrated in FIG. 8. The second exhaust conductance means a conductance that allows the pressure in the process chamber 201 to be maintained at a predetermined level and that is automatically adjusted by controlling the APC valve 244 via the controller 121.

In addition, the degree of opening (first degree of opening) of the APC valve 244 installed at the exhaust line configured to exhaust the inside of the process chamber 201 is fully closed to suspend controlling of the degree of opening of the APC valve 244 (feedback control) when the TEA gas is supplied at the first flow rate, and may be opened to control the degree of opening of the APC valve 244 when the TEA gas is supplied at the second flow rate. That is, the exhaust line configured to exhaust the inside of the process chamber 201 may be blocked when the TEA gas is supplied at the first flow rate, and may be opened when the TEA gas is supplied at the second flow rate. In this case, a total flow rate of gases supplied into the process chamber 201 (i.e., the sum of the flow rates of the TEA gas and the $N_2$ gas) when the TEA gas is supplied at the first flow rate is greater than the exhaust flow rate of a gas exhausted via the exhaust line. In addition, the difference between the total flow rate and the exhaust flow rate is maximized. Thus, the pressure in the process chamber 201 may be more rapidly raised to be regulated to a predetermined pressure within a shorter time period. That is, a time needed to regulate the pressure in the process chamber 201 to the predetermined pressure may be shortened more. In addition, since the pressure in the process chamber 201 may be more rapidly raised to a high pressure, the amount of carbon (C) present in the process chamber 201 may be increased more, the amount of carbon (C) added to the first layer may be increased more, and the concentration of carbon (C) contained in the first layer may be increased more.

In addition, the degree of opening (first degree of opening) of the APC valve 244 installed at the exhaust line configured to exhaust the inside of the process chamber 201 may not be fully closed when the TEA gas is supplied at the first flow rate. For example, the APC valve 244 may be slightly opened to control the degree of opening of the APC valve 244. That is, when the TEA gas is supplied at the first flow rate, a fine gas flow may be formed from the inside of the process chamber 201 toward the vacuum pump 246 by slightly opening the APC valve 244 (by extremely reducing (narrowing) the first degree of opening) without adjusting the first exhaust conductance to zero. Even in this case, the total flow rate of gases supplied into the process chamber 201 may also be adjusted to be greater than the exhaust flow rate of a gas exhausted via the exhaust line. In this case, this state in which the total flow rate of gases supplied into the process chamber 201 is greater than the exhaust flow rate of gas exhausted via the exhaust line may be caused by controlling flow rate adjustment and pressure regulation by the mass flow controllers 241*b* and 241*f* and the APC valve 244 through the controller 121, respectively. In this case, the pressure in the process chamber 201 may also be rapidly raised to the predetermined pressure and the concentration of carbon (C) contained in the first layer may also be increased. However, the pressure in the process chamber 201 may be more rapidly raised and the concentration of carbon (C) contained in the first layer may be more increased when the degree of opening (first degree of opening) of the APC valve 244 is fully closed.

In addition, the pressure in the process chamber 201 is changed according to a balance between the flow rate of a gas supplied into the process chamber 201 and the exhaust speed (exhaust conductance) of a gas exhausted by the exhaust line configured to exhaust the inside of the process chamber 201. Since it may take a time to stabilize this balance, the pressure in the process chamber 201 may not be raised to the predetermined pressure within a short time period while exhausting is performed using the exhaust line, thereby lowering product yield. In particular, when the flow rate of a gas supplied into the process chamber 201 is lowered, it may take a time to raise the pressure in the process chamber 201, thereby greatly lowering product yield. In contrast, according to the first embodiment, when the TEA gas is supplied at the first flow rate, the degree of opening (first degree of opening) of the APC valve 244 installed at the exhaust line is fully closed, the APC valve 244 is slightly opened (first degree of opening is lowered), or the degree of opening (first degree of opening) of the APC valve 244 is set to be less than the second degree of opening. Thus, the pressure in the process chamber 201 may be raised within a short time period and the film-forming yield may be improved, thereby increasing the concentration of carbon (C) contained in the first layer.

In addition, $N_2$ gas may be supplied at a third flow rate when the TEA gas is supplied at the first flow rate, and may be supplied at a fourth flow rate that is less than the third flow rate when the TEA gas is supplied at the second flow rate. That is, when the flow rate of the TEA gas supplied into the process chamber 201 is lowered, the flow rate of the $N_2$ gas supplied into the process chamber 201 may also be lowered. In this case, partial pressure of the TEA gas, i.e., the concentration of the TEA gas in the process chamber 201, may be prevented from being lowered in the process chamber 201 after the flow rate of the TEA gas supplied into the process chamber 201 is lowered. In addition, an actual supply rate of the TEA gas to the wafer 200, i.e., the number of TEA molecules supplied to the wafer 200, may be suppressed from being reduced. That is, the partial pressure and concentration of the TEA gas and the number of TEA molecules supplied to the wafer 200 when the TEA gas is supplied at the first flow rate and the pressure in the process chamber 201 reaches the predetermined pressure may be maintained constant even after the flow rate of the TEA gas supplied into the process chamber 201 is lowered. As a result, the amount of carbon (C) added to the first layer, i.e., the concentration of carbon (C) contained in the first layer, may be suppressed from being lowered.

In addition, in step 2 (TEA gas supply process), i.e., during the first TEA gas supply process and the second TEA gas supply process, the ratio of the flow rate of the TEA gas to that of the $N_2$ gas supplied into the process chamber 201 is preferably maintained constant. That is, when the flow rates of the TEA gas and the $N_2$ gas supplied into the process chamber 201 are lowered to the second and fourth flow rates, respectively, the ratio of the first flow rate to the third flow rate and the ratio of the second flow rate to the fourth flow rate are preferably set to be the same. That is, the second flow rate and the fourth flow rate may be set to satisfy (first flow rate:third flow rate=second flow rate:fourth flow rate). In other words, in step 2, the ratio (percentage) of the flow rate of the TEA gas to the sum of the flow rates of the TEA gas and the $N_2$ gas, i.e., the rate of the TEA gas (percentage), is preferably maintained constant. That is, the flow rate of the TEA gas/(the flow rate of the TEA gas+the flow rate of the $N_2$ gas) is preferably maintained constant. That is, when the flow rates of the TEA gas and the $N_2$ gas supplied into the process chamber 201 are lowered to the second flow rate and the fourth flow rate, respectively, the second flow rate and the fourth flow rate are preferably set to satisfy that (first flow rate/(first flow rate+third flow rate))=(second flow rate/(second flow rate+fourth flow rate)).

The partial pressure $V_T$(Pa) of the TEA gas in the process chamber 201 may be expressed as an equation: $VT=[Q_T/(Q_T+Q_N)]\times V$ when the flow rate of the TEA gas supplied into the process chamber 201 is $Q_T$(sccm), the flow rate of the $N_2$ gas supplied into the process chamber 201 is $Q_N$(sccm), and the total pressure in the process chamber 201 is V(Pa). Thus, if the flow rates of the TEA gas and the $N_2$ gas supplied into the process chamber 201 are lowered to the second flow rate and the fourth flow rate, respectively, then the partial pressure $V_T$ of the TEA gas in the process chamber 201 is maintained constant when the second flow rate and the fourth flow rate are set to maintain the rate of the TEA gas, i.e., $[Q_T/(Q_T+Q_N)]$, constant. That is, the partial pressure $V_T$ of the TEA gas in the process chamber 201 may be maintained constant by maintaining the rate of the TEA gas $[=Q_T/(Q_T+Q_N)]$ constant while maintaining the pressure in the process chamber 201 at a predetermined pressure V, at least after the pressure in the process chamber 201 reaches a predetermined pressure V. As a result, an actual supply state of the TEA gas with respect to the wafer 200 may be maintained constant both before and after the flow rate of the TEA gas is lowered. That is, the number of TEA molecules supplied to the wafer 200 may be maintained constant both before and after the flow rate of the TEA gas is lowered. Accordingly, after the flow rate of the TEA gas is lowered, the amount of carbon (C) added to the first layer, i.e., the concentration of carbon (C) contained in the first layer, may be suppressed from being lowered.

In addition, in step 2 (TEA gas supply process), the amount of carbon (C) added to the first layer may be changed by changing the ratio of the flow rate of the TEA gas to that of the $N_2$ gas supplied into the process chamber 201 when the flow rate of the TEA gas supplied into the process chamber 201 is lowered, i.e., by changing the partial pressure in the process chamber 201. For example, when the flow rate of the TEA gas supplied into the process chamber 201 is lowered, the amount of carbon (C) added to the first layer may be reduced by adjusting the flow rate of the $N_2$ gas to satisfy (fourth flow rate)>(third flow rate)$_x$(second flow rate)/(first flow rate), i.e., by lowering the partial pressure of the TEA gas in the process chamber 201 by reducing the rate of the TEA gas. In addition, for example, when the flow rate of the TEA gas supplied into the process chamber 201 is lowered, the amount of carbon (C) added to the first layer may be reduced by adjusting the flow rate of the $N_2$ gas to satisfy (fourth flow rate)<(third flow rate)$_x$(second flow rate)/(first flow rate), i.e., by increasing the partial pressure of the TEA gas in the process chamber 201 by increasing the rate of the TEA gas.

In addition, when the TEA gas is supplied at the first flow rate, the pressure in the process chamber 201 may be set to fall within, for example, a range of 1 to 13,300 Pa, and preferably, a range of 399 to 3,990 Pa. When the pressure in the process chamber 201 is set to be comparatively high, the TEA gas may be thermally activated in a non-plasma state. In addition, since the TEA gas may be thermally activated and supplied to cause a soft reaction, the modification described above may be softly performed. The supply flow rate of the TEA gas may be controlled to be within, for example, a range of 200 to 4,000 sccm using by the mass flow controller 241*b*. The supply flow rate of the $N_2$ gas may be controlled to be within, for example, a range of 200 to 10,000 sccm using each of the mass flow controllers 241*f*, 241*e*, and 241*g*. In this case, the partial pressure of the TEA gas in the process chamber 201 is controlled to be within a range of 0.02 to 12,667 Pa. A time period in which the thermally activated TEA gas is supplied to the wafer 200, i.e., a gas supply time (exposure time), may be, for example, within a range of 6 to 24 seconds. In this case, similar to step 1, the temperature of the heater 207 is set such that the temperature of the wafer 200 may be, for example, within a range of 250 to 700° C., preferably, 300 to 650° C., and more preferably, 350 to 600° C.

When the TEA gas is supplied at the second flow rate, the pressure in the process chamber 201 may be, for example, within a range of 1 to 13,300 Pa, and preferably, a range of 399 to 3,990 Pa, similar to when the TEA gas is supplied at the first flow rate. The supply flow rate of the TEA gas controlled by the mass flow controller 241*b* may be, for example, within a range of 100 to 2,000 sccm. The supply flow rate of the $N_2$ gas controlled by the mass flow controllers 241*f*, 241*e*, and 241*g* may be, for example, within a range of 100 to 5,000 sccm. In this case, the partial pressure of the TEA gas in the process chamber 201 may be within a range of 0.02 to 12,667 Pa, similar to when the TEA gas is supplied at the first flow rate. A time period in which the thermally activated TEA gas is supplied to the wafer 200, i.e., a gas supply time (exposure time), may be, for example, within a range of 12 to 120 seconds. In this case, similar to step 1, the temperature of the heater 207 is set such that the temperature of the wafer 200 may be, for example, within a range of 250 to 700° C., preferably, 300 to 650° C., and more preferably, 350 to 600° C., similar to when the TEA gas is supplied at the first flow rate.

Remaining Gas Removal

After the first layer is formed, the valve 243*b* of the second gas supply pipe 232*b* is closed and the supply of the TEA gas is suspended. In this case, the inside of the process chamber 201 is vacuum-exhausted by the vacuum pump 246 in a state in which the APC valve 244 of the exhaust pipe 231 is opened (preferably, in a state in which the APC valve 244 is fully opened), and either the TEA gas remaining in the process chamber 201 after non-reaction or contribution to formation of the first layer or reaction byproducts are removed from the inside of the process chamber 201. In addition, in this case, supply of $N_2$ gas as an inert gas into the process chamber 201 is maintained while the valves 243f, 243e, and 243g are opened. The $N_2$ gas serves as a purge gas, and causes either the TEA gas remaining in the process chamber 201 after non-reaction or contribution to formation of the first layer or the reaction byproducts to be effectively removed from the inside of the process chamber 201.

In this case, a gas remaining in the process chamber 201 may not be completely removed and the inside of the process chamber 201 may not be completely purged. When a small amount of the gas is remained in the process chamber 201, step 3 performed after step 2 is not badly influenced by this gas. In this case, the flow rate of the $N_2$ gas to be supplied into the process chamber 201 may not be high. For example, the inside of the process chamber 201 may be purged by supplying an amount of $N_2$ gas corresponding to the capacity of the reaction tube 203 (process chamber 201) such that step 3 is not badly influenced by this gas. As described above, a purge time may be shortened by not completely purging the inside of the process chamber 201, thereby improving the throughput. In addition, consumption of the $N_2$ gas may be suppressed to a necessary minimum value.

As an amine-based gas, not only triethylamine [$(C_2H_5)_3N$, abbreviated to TEA] but also an ethylamine-based gas obtained by evaporating diethylamine [$(C_2H_5)_2NH$, abbreviated to DEA], monoethylamine ($C_2H_5NH_2$, abbreviated to MEA) or the like; a methylamine-based gas obtained by evaporating trimethylamine [$(CH_3)_3N$, abbreviated to TMA], dimethylamine [$(CH_3)_2NH$, abbreviated to DMA], monomethylamine ($CH_3NH_2$, abbreviated to MMA), or the like; a propylamine-based gas obtained by evaporating tripropylamine [$(C_3H_7)_3N$, abbreviated to TPA], dipropylamine [$(C_3H_7)_2NH$, abbreviated to DPA], monopropylamine ($C_3H_7NH_2$, abbreviated to MPA), or the like; an isopropyl amine-based gas obtained by evaporating triisopropylamine [$(CH_3)_2CH]_3N$, abbreviated to TIPA), diisopropylamine [$(CH_3)_2CH]_2NH$, abbreviated to DIPA), monoisopropylamine [$(CH_3)_2CHNH_2$, abbreviated to MIPA), or the like; a butyl-based gas obtained by evaporating tributylamine [$(C_4H_9)_3N$, abbreviated to TBA], dibutylamine [$(C_4H_9)_2NH$, abbreviated to DBA], monobutylamine ($C_4H_9NH_2$, abbreviated to MBA), or the like; or an isobutylamine-based gas obtained by evaporating triisobutylamine [$(CH_3)_2CHCH_2]_3$N, abbreviated to TIBA), diisobutylamine ([$(CH_3)_2CHCH_2]_2$NH, abbreviated to DIBA), monoisobutylamine [$(CH_3)_2CHCH_2NH_2$, abbreviated to MIBA] or the like may be used.

That is, for example, at least one gas among $(C_2H_5)_xNH_{3-x}$, $(CH_3)_xNH_{3-x}$, $(C_3H_7)_xNH_{3-x}$, $[(CH_3)_2CH]_xNH_{3-x}$, $(C_4H_9)_xNH_{3-x}$, and $[(CH_3)_2CHCH_2]_xNH_{3-x}$ may be preferably used as an amine-based gas. Here, 'x' denotes an integer between 1 and 3.

In addition, as the amine-based gas, a gas consisting of three elements, such as carbon, nitrogen, and hydrogen, and having a composition ratio in which the number of carbon atoms is greater than the number of nitrogen atoms (in one molecule). That is, at least one gas containing an amine selected from the group consisting of TEA, DEA, MEA, TMA, DMA, TPA, DPA, MPA, TIPA, DIPA, MIPA, TBA, DBA, MBA, TIBA, DIBA, and MIBA is preferably used as the amine-based gas.

If a chlorosilane-based source gas, e.g., the HCDS gas that contains a specific element (silicon) and a halogen element (chlorine), is used as a source gas, then an amine-based gas consisting of three elements, such as carbon, nitrogen, and hydrogen, and having a composition ratio in which the number of carbon elements is greater than the number of nitrogen elements (in one molecule), e.g., the TEA gas or the DEA gas, may be used as the first reactive gas in order to increase the concentration of carbon in the first layer formed in step 2, that is, the concentration of carbon in a SiOCN film or a SiOC film to be formed during a process performed a predetermined number of times (to be described later).

In contrast, if a chlorosilane-based source gas, e.g., the HCDS gas that contains a specific element (silicon) and a halogen element (chlorine), is used as a source gas, when an amine-based gas, such as MMA gas, or an organic hydrazine-based gas, such as MMH gas or DMH gas consisting of three elements, such as carbon, nitrogen, and hydrogen, and having a composition ratio in which the number of carbon atoms is not greater than the number of nitrogen atoms (in one molecule) (which will be described below), is used as the first reactive gas, then the concentration of carbon in the first layer, i.e., the concentration of carbon in the SiOCN film or the SiOC film, is less than when an amine-based gas consisting of three elements, such as carbon, nitrogen, and hydrogen, and having a composition ratio in which the number of carbon atoms is greater than the number of nitrogen atoms (in one molecule) is used as the first reactive gas. Accordingly, an appropriate concentration of carbon cannot be achieved.

In addition, a gas having a composition ratio in which a plurality of ligands containing carbon atoms are contained (in one molecule), i.e., a gas having a composition ratio in which a plurality of hydrocarbon groups (e.g., alkyl groups) are contained (in one molecule), is preferably used as an amine-based gas. In detail, a gas having a composition ratio in which two or three ligands (hydrocarbon groups, such as alkyl groups) containing carbon elements are contained (in one molecule), is preferably used as the amine-based gas. For example, at least one gas containing an amine selected from the group consisting of TEA, DEA, TMA, DMA, TPA, DPA, TIPA, DIPA, TBA, DBA, TIBA, and DIBA is preferably used.

If a chlorosilane-based source gas, such as the HCDS gas containing a specific element (silicon) and a halogen element (chlorine), is used as a source gas, an amine-based gas (such as the TEA gas or the DEA gas) that consists of three elements, such as carbon, nitrogen, and hydrogen, and has a composition ratio in which a plurality of ligands containing carbon atoms are contained (in one molecule), i.e., an amine-based gas having a composition ratio in which a plurality of hydrocarbon groups (alkyl groups) are contained in one molecule, may be used as the first reactive gas in order to increase the concentration of carbon in the first layer, that is, the concentration of carbon in the SiOCN film or the SiOC film.

In contrast, if a chlorosilane-based source gas, e.g., the HCDS gas that contains a specific element (silicon) and a halogen element (chlorine), is used as a source gas, when an amine-based gas such as MMA gas or an organic hydrazine-based gas such as the MMH gas (which will be described below), which has a composition ratio in which a plurality of ligands containing carbon are not contained (in one molecule) (which will be described below), is used as the first reactive gas, then the concentration of carbon in the first layer, i.e., the concentration of carbon in the SiOCN film or the SiOC film, is less than when an amine-based gas having a composition ratio in which a plurality of ligands containing carbon are contained (in one molecule) is used as the first reactive gas. Accordingly, an appropriate concentration of carbon cannot be achieved.

In addition, when an amine-based gas (e.g., DEA gas) having a composition ratio in which two ligands containing carbon atoms (hydrocarbon groups such as alkyl groups) are contained (in one molecule) is used as the first reactive gas, a cycle rate (thickness of a SiOCN layer or a SiOC layer formed per unit cycle) may be improved more and the ratio of the concentration of nitrogen to the concentration of carbon (nitrogen concentration/carbon concentration) in the first layer, i.e., the ratio of the concentration of nitrogen to the concentration of carbon (nitrogen concentration/carbon concentration) in the SiOCN film or the SiOC film, may be higher than when an amine-based gas (e.g., TEA gas) having a composition ratio in which three ligands containing carbon atoms (hydrocarbon groups such as alkyl groups) are contained (in one molecule) is used.

In contrast, when an amine-based gas (e.g., TEA gas) having a composition ratio in which three ligands containing carbon atoms (hydrocarbon groups such as alkyl groups) are contained (in one molecule) is used as the first reactive gas, the ratio of the concentration of carbon to the concentration of nitrogen (carbon concentration/nitrogen concentration) in the first layer, i.e., the ratio of the concentration of carbon to the concentration of nitrogen (carbon concentration/nitrogen concentration) in the SiOCN film or the SiOC film may be higher than when an amine-based gas (e.g., DEA gas) having a composition ratio in which two ligands containing carbon atoms (hydrocarbon groups such as alkyl groups) are contained (in one molecule) is used.

That is, a cycle rate or the concentration of nitrogen or carbon in the SiOCN film or the SiOC film to be formed may be finely controlled by appropriately adjusting a gas species of the first reactive gas according to the number of ligands containing carbon atoms (the number of hydrocarbon groups such as alkyl groups) in the first reactive gas.

Gas specifies (composition) of an amine-based gas serving as a first reactive gas may be appropriately selected to increase the concentration of carbon in the SiOCN film or the SiOC film as described above. However, in order to more increase the concentration of carbon, for example, the pressure in the process chamber 201 when an amine-based gas (TEA gas) is supplied to the wafer 200 is preferably higher than the pressure in the process chamber 201 when a chlorosilane-based source gas (HCDS gas) is supplied to the wafer 200 (in step 1), and is preferably higher than the pressure in the process chamber 201 when an oxygen-containing gas ($O_2$ gas) is supplied to the wafer 200 (in step 3 which will be described below). In addition, in this case, the pressure in the process chamber 201 when the $O_2$ gas is supplied to the wafer 200 (in step 3) is preferably higher than the pressure in the process chamber 201 when the HCDS gas is supplied to the wafer 200 (in step 1). That is, if the pressure in the process chamber 201 when the HCDS gas is supplied to the wafer 200 is $P_1$ [Pa], the pressure in the process chamber 201 when the TEA gas is supplied to the wafer 200 is $P_2$ [Pa], and the pressure in the process chamber 201 when the $O_2$ gas is supplied to the wafer 200 $P_3$ [Pa], the pressures $P_1$ to $P_3$ are preferably set to satisfy $P_2>P_1$, $P_3$ and are more preferably set to satisfy $P_2>P_3>P_1$. In other words, the pressure in the process chamber 201 when the TEA gas is supplied to the wafer 200 is preferably highest among those in steps 1 to 3.

In contrast, in order to appropriately suppress an increase in the concentration of carbon in the SiOCN film or the SiOC film, the pressure in the process chamber 201 when an amine-based gas (TEA gas) is supplied to the wafer 200 is preferably less than or equal to the pressure in the process chamber 201 when an oxygen-containing gas ($O_2$ gas) is supplied to the wafer 200 in step 3 or the pressure in the process chamber 201 when a chlorosilane-based source gas (HCDS gas) is supplied to the wafer 200 in step 1. That is, the pressures $P_1$ to $P_3$ are preferably set to satisfy $P_3 \geq P_2$ or $P_3$, $P_1 \geq P_2$.

That is, the pressure in the process chamber 201 when the amine-based gas is supplied may be appropriately controlled to finely adjust the carbon concentration in the SiOCN film or the SiOC film.

In addition to $N_2$ gas, a rare gas such as Ar gas, He gas, Ne gas, Xe gas, or the like, may be used as the inert gas.

Step 3

$O_2$ Gas Supply

After step 2 is terminated and the remaining gas in the process chamber 201 is removed, the valve 243*c* of the third gas supply pipe 232*c* is opened to cause $O_2$ gas to flow through the third gas supply pipe 232*c*. The flow rate of the $O_2$ gas flowing through the third gas supply pipe 232*c* is controlled by the mass flow controller 241*c*. The flow-rate-controlled $O_2$ gas is supplied into the process chamber 201 via the gas supply hole 250*c* of the third nozzle 249*c*. The $O_2$ gas supplied into the process chamber 201 is thermally activated (excited) to be exhausted through the exhaust pipe 231. Here, the thermally activated $O_2$ gas is supplied to the wafer 200. Simultaneously, the valve 243*g* is opened to cause $N_2$ gas to flow through the third inert gas supply pipe 232*g*. The $N_2$ gas is supplied into the process chamber 201 to be exhausted through the exhaust pipe 231 with the $O_2$ gas. In addition, here, in order to prevent invasion of the $O_2$ gas into the first nozzle 249*a* and the second nozzle 249*b*, the valves 243*e* and 243*f* are opened to cause the $N_2$ gas to flow through the first inert gas supply pipe 232*e* and the second inert gas supply pipe 232*f*. The $N_2$ gas is supplied into the process chamber 201 via the first gas supply pipe 232*a*, the second gas supply pipe 232*b*, the first nozzle 249*a*, and the second nozzle 249*b* to be exhausted through the exhaust pipe 231.

Here, the APC valve 244 is appropriately adjusted such that the pressure in the process chamber 201 is a pressure within a range of, for example, 1 to 3,000 Pa. As the pressure in the process chamber 201 arrives at such a relatively high pressure, the $O_2$ gas can be thermally activated with non-plasma. In addition, since the $O_2$ gas may be thermally activated to be supplied to generate a soft reaction, oxidation (to be described below) may be softly performed. A supply flow rate of the $O_2$ gas controlled by the mass flow controller 241*c* is a flow rate within a range of, for example, 100 to 10,000 sccm. A supply flow rate of the $N_2$ gas controlled by the mass flow controllers 241*g*, 241*e* and 241*f* may be a flow rate within a range of, for example, 100 to 10,000 sccm. Here, a partial pressure of the $O_2$ gas in the process chamber 201 is a pressure within a range of 0.01 to 2,970 Pa. A time in which the thermally activated $O_2$ gas is supplied to the wafer 200, i.e., a gas supply time (exposure time), is a time within a range of for example, 1 to 120 seconds, preferably 1 to 60 seconds. Here, like steps 1 and 2, the temperature of the heater 207 is set such that the temperature of the wafer 200 is a temperature within a range of, for example, 250 to 700° C., preferably 300 to 650° C., and more preferably 350 to 600° C.

Here, the gas flowing into the process chamber 201 is the $O_2$ gas thermally activated by increasing the pressure in the process chamber 201, and neither HCDS gas nor TEA gas flows into the process chamber 201. Accordingly, the $O_2$ gas does not generate a gaseous reaction, and the activated $O_2$ gas reacts with at least a portion of the first layer including Si, N and C formed on the wafer 200 in step 2. Accordingly, the first layer is oxidized to be modified as a layer including silicon, oxygen, carbon, and nitrogen, which is a second layer, i.e., a silicon oxycarbonitride layer (SiOCN layer), or a layer including silicon, oxygen and carbon, i.e., a silicon oxycarbide layer (SiOC layer).

In addition, as the $O_2$ gas is thermally activated to be flowed into the process chamber 201, the first layer may be thermally oxidized to be modified (changed) into the SiOCN layer or the SiOC layer. Here, an O component is added to the first layer to modify the first layer into the SiOCN layer or the SiOC layer. In addition, the Si—O bonding in the first layer is increased by an action of the thermal oxidation due to the $O_2$ gas, and the Si—N bonding, Si—C bonding, and Si—Si bonding are reduced to reduce a ratio of an N component, a ratio of a C component, and a ratio of a Si component in the first layer. In addition, here, as the thermal oxidation time is lengthened or an oxidizing power of the thermal oxidation is increased, most of the N component can be desorbed to reduce the N component to an impurity level or substantially remove the N component. That is, the first layer may be modified into the SiOCN layer or the SiOC layer while varying the composition ratio thereof in a direction of increasing the oxygen concentration or in a direction of reducing the nitrogen concentration, the carbon concentration and the silicon concentration. In addition, here, the process conditions such as the pressure in the process chamber 201, the gas supply time, or the like, may be controlled to finely adjust a ratio of the O component in the SiOCN layer or the SiOC layer, i.e., the oxygen concentration, and the composition ratio of the SiOCN layer or the SiOC layer may thus be more finely controlled.

In addition, it has been confirmed that the C component is richer than the N component in the first layer formed in steps 1 and 2. For example, in an experiment, the carbon concentration was twice the nitrogen concentration or more. That is, as the oxidation is blocked before the N component in the first layer is completely desorbed by an action of the thermal oxidation due to the $O_2$ gas, i.e., in a state in which the N component remains, the C component and the N component remain in the first layer so that the first layer is modified into the SiOCN layer. In addition, the C component remains in the first layer even in a step in which most of the N component in the first layer is desorbed by the action of the thermal oxidation due to the $O_2$ gas, and in this state, the oxidation is blocked so that the first layer is modified into the SiOC layer. That is, the gas supply time (oxidation processing time) or the oxidizing power may be controlled to control a ratio of the C component, i.e., the carbon concentration, and one of the SiOCN layer and the SiOC layer may thus be formed while controlling the composition ratio. In addition, here, the process conditions, such as the pressure in the process chamber 201, the gas supply time, or the like, may be controlled to finely adjust the ratio of the O component in the SiOCN layer or the SiOC layer, i.e., the oxygen concentration, and the composition ratio of the SiOCN layer or the SiOC layer may thus be more finely controlled.

In addition, here, it is preferable that the oxidation reaction of the first layer be unsaturated. For example, when the first layer having a thickness of less than one atomic layer to several atomic layers is formed in steps 1 and 2, it is preferable that a portion of the first layer be oxidized. In this case, the oxidation is performed under the conditions in which the oxidation reaction of the first layer is unsaturated such that the entire first layer having a thickness of less than one atomic layer to several atomic layers is not oxidized.

The process conditions in step 3 may be the above-mentioned process conditions to cause the oxidation reaction of the first layer to be unsaturated, but are set to the following process conditions to cause easy unsaturation of the oxidation reaction of the first layer:

Wafer temperature: 500 to 650° C.

Pressure in process chamber: 133 to 2,666 Pa $O_2$ gas partial pressure: 33 to 2,515 Pa $O_2$ gas supply flow rate: 1,000 to 5,000 sccm $N_2$ gas supply flow rate: 300 to 3,000 sccm $O_2$ gas supply time: 6 to 60 seconds Remaining Gas Removal After the second layer is formed, the valve 243*c* of the third gas supply pipe 232*c* is closed to stop supply of the $O_2$ gas. Here, the inside of the process chamber 201 is vacuum-exhausted by the vacuum pump 246 in a state in which the APC valve 244 of the exhaust pipe 231 is open (preferably, in a state in which the APC valve 244 is fully open) in order to remove either the $O_2$ gas or the reaction byproduct after non-reaction or contribution to formation of the second layer and remaining in the process chamber 201 from the inside of the process chamber 201. In addition, here, supply of the $N_2$ gas into the process chamber 201 is maintained in a state in which the valves 243*g*, 243*e*, and 243*f* are open. The $N_2$ gas serves as the purge gas to increase an effect of removing the $O_2$ gas or the reaction byproduct after non-reaction or contribution to formation of the second layer and remaining in the process chamber 201 from the inside of the process chamber 201.

In addition, here, the gas remaining in the process chamber 201 may not be completely removed, and the inside of the process chamber 201 may not be completely purged. When the gas remaining in the process chamber 201 is minute, there is no bad influence in step 1 performed thereafter. Here, a flow rate of the $N_2$ gas supplied into the process chamber 201 need not be a large flow rate, and for example, an amount of gas substantially equal to a capacity of the reaction tube 203 (the process chamber 201) may be supplied to perform the purge such that there is no bad influence generated in step 1. As described above, as the inside of the process chamber 201 is not completely purged, the purge time can be reduced to improve throughput. In addition, consumption of the $N_2$ gas may be suppressed to a necessary minimum value.

In addition to the $O_2$ gas, nitrous oxide ($N_2O$) gas, nitric oxide (NO) gas, nitrogen dioxide ($NO_2$) gas, ozone ($O_3$) gas, hydrogen ($H_2$) gas+oxygen ($O_2$) gas, $H_2$ gas+$O_3$ gas, vapor ($H_2O$) gas, carbon monoxide (CO) gas, carbon dioxide ($CO_2$) gas, or the like may be used as the oxygen-containing gas (oxidizing gas). In addition to the $N_2$ gas, a rare gas, such as Ar gas, He gas, Ne gas, Xe gas, or the like, may be used as the inert gas.

Perform Cycle Predetermined Number of Times

The above-mentioned steps 1 to 3 are set as one cycle, and the cycle may be performed a predetermined number of times to form a film including silicon, oxygen, carbon and nitrogen, i.e., a silicon oxycarbonitride (SiOCN) film, or a film including silicon, oxygen and carbon, i.e., a silicon oxycarbide (SiOC) film, which has a predetermined composition and a predetermined film thickness, on the wafer 200. The cycle is preferably performed a plurality of times. That is, it is preferable that a thickness of the SiOCN layer or the SiOC layer formed per cycle be set to be smaller than a desired film thickness, and the cycle be performed a plurality of times until the thickness arrives at the desired film thickness.

When the cycle is performed a plurality of times, the phrase "predetermined gas is supplied to the wafer 200" in each step at least after a second cycle means "predetermined gas is supplied to a layer formed on the wafer 200, i.e., the outermost surface of the wafer 200, which is a stacked structure," and the phrase "predetermined layer is formed on the wafer 200" means "predetermined layer is formed on a layer formed on the wafer 200, i.e., the outermost layer of the wafer 200, which is a stacked structure." This is similar to the above-mentioned description. In addition, this will be similar in the following other embodiments.

Purge and Atmospheric Pressure Recovery

When film-forming is performed to form a SiOCN film or a SiOC film having a predetermined composition and a predetermined film thickness, the valves 243*e*, 243*f*, and 243*g* are opened to supply $N_2$ gas serving as an inert gas into the process chamber 201 via the first inert gas supply pipe 232*e*, the second inert gas supply pipe 232*f*, and the third inert gas supply pipe 232*g* and exhaust the $N_2$ gas via the exhaust pipe 231. The $N_2$ gas may also serve as a purge gas, and allows the inside of the process chamber 201 to be purged with the inert gas, thereby removing a gas or reaction byproducts remaining in the process chamber 201 from the inside of the process chamber 201 (purging). Thereafter, the atmosphere in the process chamber 201 is substituted with the inert gas (inert gas substitution) to return the pressure in the process chamber 201 to a normal pressure (atmospheric pressure recovery).

Boat Unloading and Wafer Discharging

Then, the seal cap 219 is moved downward by the boat elevator 115 to open the lower end of the reaction tube 203, and at the same time, the processed wafer 200 is unloaded from the lower end of the reaction tube 203 to the outside of the reaction tube 203 (boat unloading) while being supported by the boat 217. Then, the processed wafer 200 is discharged from the boat 217 (wafer discharging).

(3) Effects of the First Embodiment

According to the first embodiment, one or more of the following effects are provided.

(a) According to the first embodiment, in step 2, when the TEA gas is supplied, first, the TEA gas is supplied at the first flow rate (first TEA gas supply process). Then, after the pressure in the process chamber 201 reaches a predetermined pressure, the TEA gas is supplied at the second flow rate that is less than the first flow rate while the predetermined pressure is maintained in the process chamber 201 (second TEA gas supply process). Thus, in step 2, a total supply rate of the TEA gas into the process chamber 201, i.e., the consumption rate of the TEA gas, may be less than when the TEA gas is continuously supplied at the first flow rate into the process chamber 201. As a result, costs for forming the SiOCN film or the SiOC film may be saved.

(b) According to the first embodiment, in step 2, the APC valve 244 installed at the exhaust line configured to exhaust the inside of the process chamber 201 is set to have a first degree of opening when the TEA gas is supplied at the first flow rate, and is set to a second degree of opening that is greater than the first degree of opening when the TEA gas is supplied at the second flow rate that is greater than the first flow rate. That is, the exhaust conductance at the exhaust line configured to exhaust the inside of the process chamber 201 is set to be a first exhaust conductance when the TEA gas is supplied at the first flow rate, and is set to be a second exhaust conductance that is greater than the first exhaust conductance when the TEA gas is supplied at the second flow rate. In other words, when the TEA gas is supplied at the first flow rate, the degree of opening of the APC valve 244 is preferably set to be the first degree of opening that is less (narrower) than the second degree of opening and the exhaust conductance is preferably set to be the first exhaust conductance that is less than the second first exhaust conductance. In this case, when the TEA gas is supplied at the first flow rate, a total flow rate of gases supplied into the process chamber 201 (i.e., the sum of the flow rates of the TEA gas and the $N_2$ gas) is preferably greater than the exhaust flow rate of a gas exhausted via the exhaust line. In this case, the pressure in the process chamber 201 may be rapidly raised to a predetermined pressure within a short time period. That is, a time needed to equalize the pressure in the process chamber 201 with the predetermined pressure may be shortened. Since the pressure in the process chamber 201 can be rapidly raised to a comparatively high pressure, the amount of carbon (C) present in the process chamber 201 may be increased, the amount of carbon (C) added to the first layer may be increased, and the concentration of carbon (C) contained in the first layer may be increased.

(c) According to the first embodiment, in step 2, the degree of opening (first degree of opening) of the APC valve 244 installed at the exhaust line configured to exhaust the inside of the process chamber 201 is fully closed to suspend control of the degree of opening of the APC valve 244 when the TEA gas is supplied at the first flow rate, and is controlled by opening the APC valve 244 when the TEA gas is supplied at the second flow rate. That is, the exhaust line configured to exhaust the inside of the process chamber 201 is blocked when the TEA gas is supplied at the first flow rate, and is opened when the TEA gas is supplied at the second flow rate. Thus, the pressure in the process chamber 201 may be more rapidly raised. As a result, a rate and productivity of forming the SiOCN film or the SiOC film may be increased. In addition, since the pressure in the process chamber 201 may be more rapidly raised to a comparatively high pressure, the amount of carbon present in the process chamber 201 may be increased, and the concentration of carbon contained in the SiOCN film or the SiOC film may be more increased.

(d) According to the first embodiment, in step 2, $N_2$ gas is supplied at the third flow rate when the TEA gas is supplied at the first flow rate, and is supplied at the fourth flow rate that is less than the third flow rate when the TEA gas is supplied at the second flow rate. That is, when the flow rate of the TEA gas supplied into the process chamber 201 is reduced, the flow rate of $N_2$ gas supplied into the process chamber 201 is also reduced. Thus, after the flow rate of the TEA gas supplied into the process chamber 201 is reduced, the partial pressure of the TEA gas in the process chamber 201, i.e., the concentration of the TEA gas in the process chamber 201, may be suppressed from being lowered. In addition, an actual supply rate of the TEA gas to the wafer 200, i.e., the number of TEA molecules supplied to the wafer 200, may be suppressed from being reduced. As a result, the amount of carbon (C) added to the SiOCN film or the SiOC film, i.e., the concentration of carbon (C) contained in the SiOCN film or the SiOC film, may be suppressed from being reduced.

(e) According to the first embodiment, in step 2, the ratio of the flow rate of the TEA gas to that of the $N_2$ gas supplied into the process chamber 201 is maintained constant. That is, when the flow rates of the TEA gas and the $N_2$ gas supplied into the process chamber 201 are lowered to the second flow rate and the fourth flow rate, respectively, the second flow rate and the fourth flow rate are set to satisfy (first flow rate:third flow rate=second flow rate:fourth flow rate). Accordingly, at least after the pressure in the process chamber 201 reaches the predetermined pressure, the partial pressure of the TEA gas in the process chamber 201 is maintained constant. As a result, an actual supply rate of the TEA gas to the wafer 200 may be maintained constant both before and after the flow rate of the TEA gas is reduced. In other words, the number of TEA molecules supplied to the wafer 200 may be maintained constant both before and after the flow rate of the TEA gas is reduced. As a result, the amount of carbon (C) added to the SiOCN film or the SiOC film, i.e., the concentration of carbon (C) contained in the SiOCN film or the SiOC film, may be suppressed from being lowered.

(f) According to the first embodiment, in step 2, when the flow rate of the TEA gas supplied into the process chamber 201 is lowered, the amount of carbon (C) added to the SiOCN film or the SiOC film may be changed by changing the ratio of the flow rate of the TEA gas to that of the $N_2$ gas supplied into the process chamber 201, i.e., by changing the partial pressure of the TEA gas in the process chamber 201. For example, when the flow rate of the TEA gas supplied into the process chamber 201 is lowered, the partial pressure of the TEA gas in the process chamber 201 may be lowered by adjusting the flow rate of the $N_2$ gas to satisfy ((fourth flow rate)>(third flow rate)×(second flow rate)/(first flow rate)), i.e., lowering the rate of the TEA gas, thereby reducing the amount of carbon (C) added to the SiOCN film or the SiOC film. In addition, for example, when the flow rate of the TEA gas supplied into the process chamber 201 is reduced, the partial pressure of the TEA gas in the process chamber 201 may be raised by adjusting the flow rate of the $N_2$ gas to satisfy (fourth flow rate)< (third flow rate)×(second flow rate)/(first flow rate), i.e., by increasing the rate of the TEA gas, thereby increasing the amount of carbon (C) added to the first layer.

(g) According to the first embodiment, a first layer containing Si, N, and C is formed by alternately performing steps 1 and 2, step 3 may be performed to oxidize the first layer to be modified into a SiOCN layer or a SiOC layer as a second layer by supplying $O_2$ gas (which is an oxygen-containing gas) as a second reactive gas, thereby adjusting a composition ratio among oxygen, carbon, and nitrogen contained in a SiOCN film or a SiOC film. In addition, in this case, $O_2$ gas may be thermally activated and supplied to increase Si—O bonds and reduce Si—C bonds, Si—N bonds, and Si—Si bonds in the SiOCN film or the SiOC film, due to an operation of the thermal oxidization. That is, this composition ratio may be changed in a direction of increasing oxygen concentration and a direction of reducing nitrogen concentration, carbon concentration, and silicon concentration. In addition, in this case, the thermal oxidation time or an oxidizing power of the thermal oxidation may be increased to change this composition ratio in a direction of increasing oxygen concentration more or a direction of reducing nitrogen concentration, carbon concentration, and silicon concentration more. In addition, in this case, a ratio of the oxygen component in the SiOCN film or the SiOC film, i.e., the concentration of oxygen, may be finely controlled by controlling the pressure in the process chamber 201 or process conditions, e.g., a gas supply time, thereby more finely controlling the composition ratio of the SiOCN film or the SiOC film. Accordingly, the dielectric constant, etching resistance, or insulating properties of the SiOCN film or the SiOC film may be improved.

Second Embodiment of the Present Invention

Next, a second embodiment of the present invention will be described.

The first embodiment has been described above with respect to a process of forming a silicon oxycarbonitride film or a silicon oxycarbide film having a predetermined composition and a predetermined film thickness on the wafer 200 using an oxygen-containing gas ($O_2$ gas) as a second reactive gas. In contrast, the second embodiment will be described below with respect to a process of forming a silicon carbonitride (SiCN) film having a predetermined composition and a predetermined film thickness on the wafer 200 using a nitrogen-containing gas ($NH_3$ gas) as a second reactive gas.

Specifically, in the second embodiment, an example of a process of forming a silicon carbonitride (SiCN) film having a predetermined composition and a predetermined film thickness on the wafer 200 in the process chamber 201 by performing a cycle a predetermined number of times (n times), the cycle including: a process of forming a silicon-containing layer containing chlorine on the wafer 200 in the process chamber 201 by supplying a chlorosilane-based source gas (HCDS gas) to the wafer 200; a process of forming a first layer containing silicon, nitrogen, and carbon by modifying the silicon-containing layer containing chlorine by supplying an amine-based gas (TEA gas) as a first reactive gas to the wafer 200 in the process chamber 201; and a process of forming a SiCN film as a second layer by modifying the first layer by supplying a nitrogen-containing gas ($NH_3$ gas) as a second reactive gas to the wafer 200 will be described.

Figure 6:
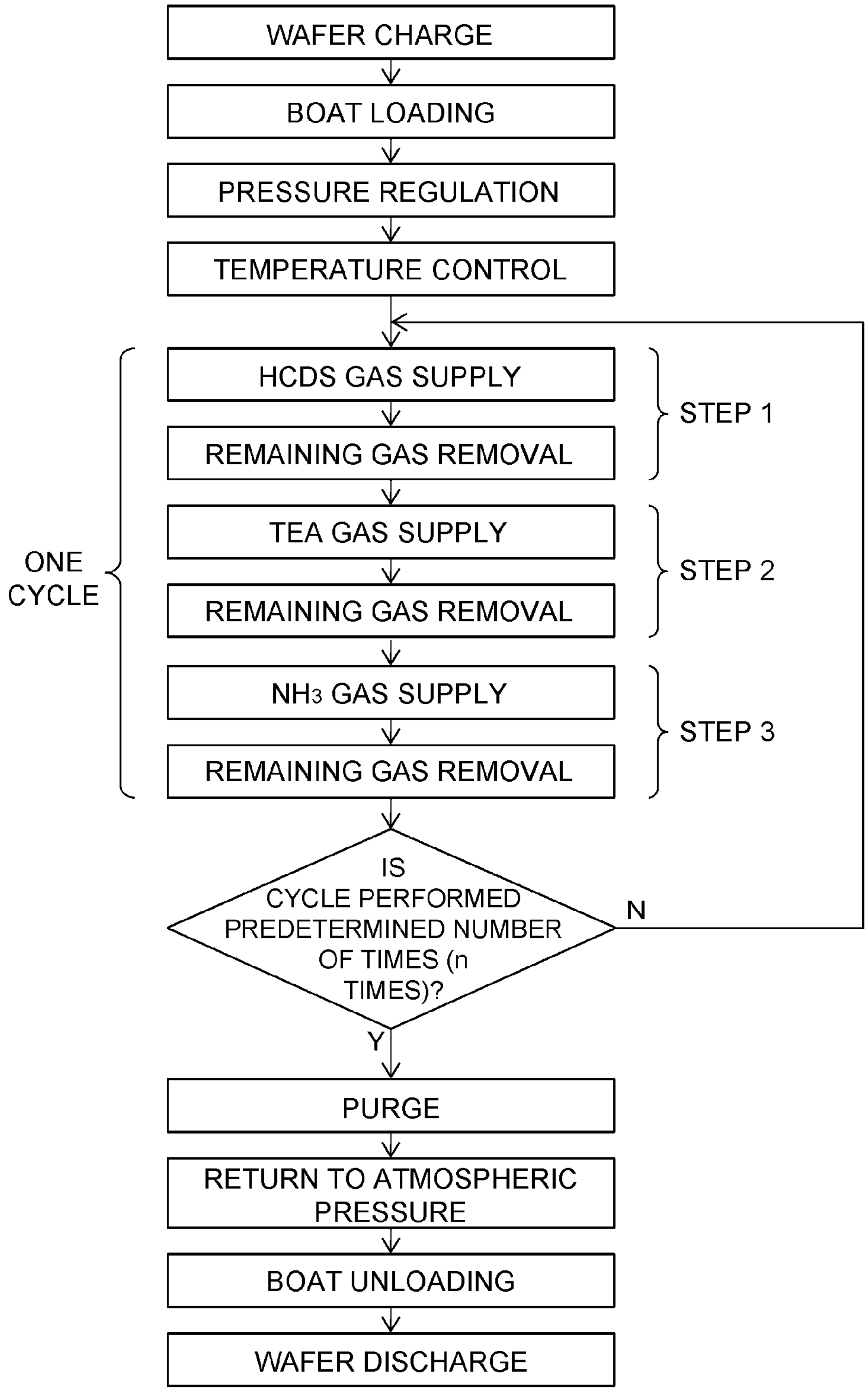
FIG. 6 is a view showing a film-forming flow according to a second embodiment of the present invention.
Figure 7:
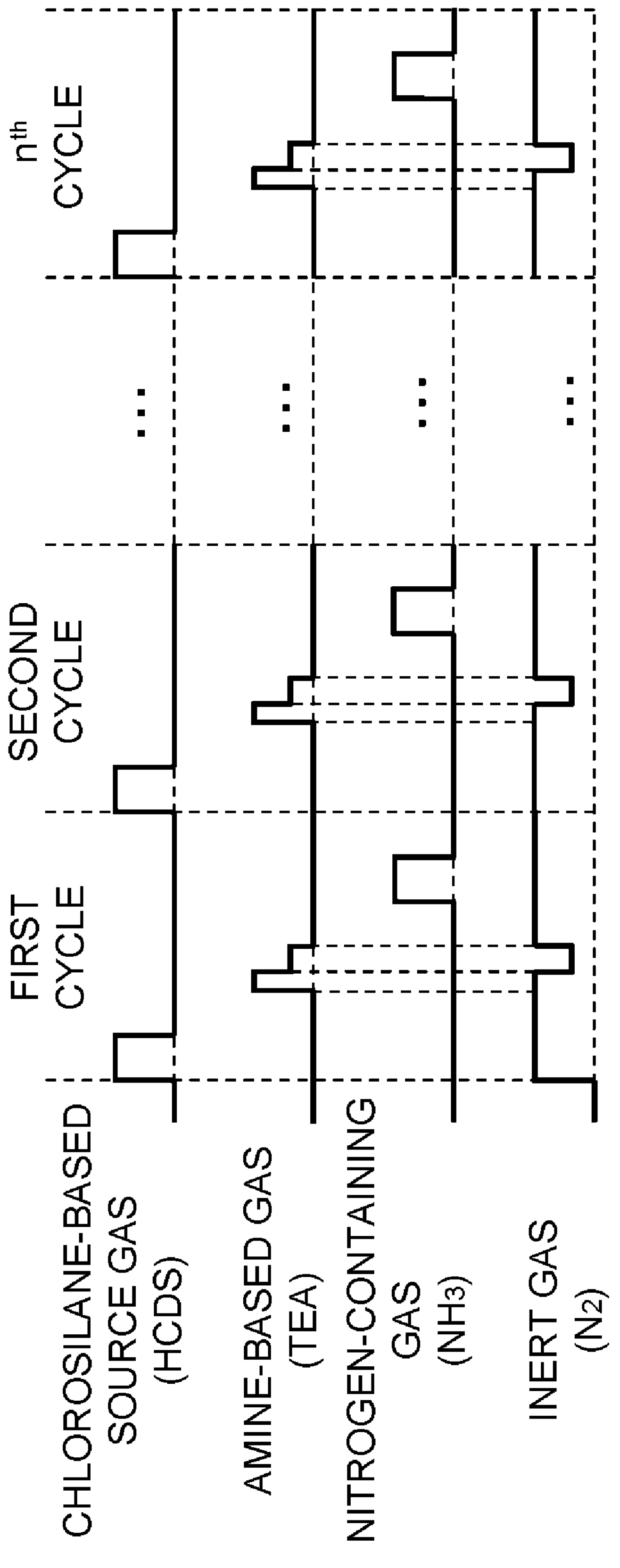
FIG. 7 is a view showing gas supply timing in a film-forming sequence according to the second embodiment of the present invention.

FIG. 6 is a view showing a film-forming flow according to a second embodiment of the present invention. FIG. 7 is a view showing gas supply timing in a film-forming sequence according to the second embodiment of the present invention. The second embodiment is substantially the same as the first embodiment, except that in step 3, thermally activated $NH_3$ gas is used as a second reactive gas. Step 3 according to the second embodiment will now be described.

Step 3

$NH_3$ Gas Supply

After step 2 is terminated and a remaining gas in the process chamber 201 is removed, the valve **243*d* of the fourth gas supply pipe 232*d* is opened to cause $NH_3$ gas to flow into the fourth gas supply pipe 232*d*. The flow rate of the $NH_3$ gas flowing through the fourth gas supply pipe 232*d* is adjusted by the mass flow controller 241*d*. The flow-rate-adjusted $NH_3$ gas is supplied into the process chamber 201 via the gas supply hole 250*c* of the third nozzle 249*c*. The $NH_3$ gas supplied into the fourth process chamber 201 is thermally activated (excited), and is exhausted via the exhaust pipe 231. In this case, the thermally activated $NH_3$ gas is supplied to the wafer 200. Simultaneously, the valve 243*g* is opened to cause $N_2$ gas to flow into the third inert gas supply pipe 232*g*. The $N_2$ gas is supplied into the process chamber 201 together with the $NH_3$ gas, and is exhausted via the exhaust pipe 231. In this case, in order to prevent invasion of the $NH_3$ gas into the first nozzle 249*a* and second nozzle 249*b*, the valves 243*e* and 243*f* are opened to cause the $N_2$ gas to flow into the first inert gas supply pipe 232*e* and the second inert gas supply pipe 232*f*. The $N_2$ gas is supplied into the process chamber 201 via the first gas supply pipe 232*a*, the second gas supply pipe 232*b*, the first nozzle 249*a*, and the second nozzle 249*b*, and is exhausted via the exhaust pipe 231**.

In this case, the APC valve 244 may be appropriately adjusted to regulate the pressure in the process chamber 201 to be within, for example, a range of 1 to 3,000 Pa. By regulating the pressure in the process chamber 201 to a comparatively high pressure as described above, the $NH_3$ gas may be thermally activated in a non plasma state. In addition, when the $NH_3$ gas is thermally activated and supplied, a soft reaction may thus occur, thereby softly performing nitridation which will be described below. The supply flow rate of the $NH_3$ gas controlled by the mass flow controller **241*c* may be a flow rate that falls within, for example, a range of 100 to 10,000 sccm. The supply flow rate of the $N_2$ gas controlled by each of the mass flow controllers 241*g*, 241*e*, and 241*f* may be a flow rate that falls within, for example, a range of 100 to 10,000 sccm. In this case, the partial pressure of the $NH_3$ gas in the process chamber 201 falls within a range of 0.01 to 2,970 Pa. A time in which the thermally activated $NH_3$ gas is supplied to the wafer 200, i.e., a gas supply time (exposure time), is within, for example, a range of 1 to 120 seconds, and preferably 1 to 60 seconds. In this case, a temperature of the heater 207 is set such that the temperature of the wafer 200** is within a range of, for example, 250 to 700° C., preferably 300 to 650° C., and more preferably 350 to 600° C., as in steps 1 and 2.

In this case, the gas flowing into the process chamber 201 is the $NH_3$ gas that is thermally activated by increasing the temperature in the process chamber 201, and neither HCDS gas nor TEA gas flows into the process chamber 201. Accordingly, the $NH_3$ gas does not cause a gaseous reaction, and the activated $NH_3$ gas reacts with at least a portion of the first layer including Si, N, and C formed on the wafer 200 in step 2. Accordingly, the first layer is nitrided to be modified as a layer including silicon, carbon and nitrogen, which is a second layer, i.e., a silicon carbonitride (SiCN) layer.

In addition, by thermally activating $NH_3$ gas and flowing it into the process chamber 201, the first layer may be thermally nitrided to be modified (changed) into a SiCN layer. In this case, the first layer is modified into the SiCN layer while increasing an N component in the first layer. In addition, in this case, through an operation of the thermal nitridation due to the $NH_3$ gas, Si—N bonds increase and Si—C bonds and Si—Si bonds decrease in the first layer, thereby lowering the ratio of a C component and a ratio of a Si component in the first layer. That is, the first layer may be modified into the SiCN layer while changing the composition ratio in a direction of increasing nitrogen concentration and a direction of reducing carbon concentration and silicon concentration. In addition, in this case, process conditions, such as the pressure in the process chamber 201 or the gas supply time, may be controlled to finely adjust a ratio of an N component (i.e., the concentration of nitrogen) in the SiCN layer, thereby more finely controlling the composition ratio of the SiCN layer.

In this case, the nitridation reaction of the first layer is preferably unsaturated. For example, when the first layer is formed to a thickness of less than one atomic layer to several atomic layers in steps 1 and 2, a portion of the first layer is preferably nitrided. In this case, the nitridation is performed under conditions in which the nitridation reaction of the first layer is unsaturated such that the entire first layer having a thickness of less than one atomic layer to several atomic layers is not nitrided.

Further, while the process conditions in step 3 may be the above-mentioned process conditions to cause the nitridation reaction of the first layer to be unsaturated, the process conditions in step 3 are set to the following process conditions to easily cause unsaturation of the nitridation reaction of the first layer:

Wafer temperature: 500 to 650° C.

Pressure in process chamber: 133 to 2,666 Pa $NH_3$ gas partial pressure: 33 to 2,515 Pa $NH_3$ gas supply flow rate: 1,000 to 5,000 sccm $N_2$ gas supply flow rate: 300 to 3,000 sccm $NH_3$ gas supply time: 6 to 60 seconds Remaining Gas Removal After the second layer is formed, the valve 243*d* of the fourth gas supply pipe 232*d* is closed to suspend the supply of the $NH_3$ gas. In this case, the inside of the process chamber 201 is vacuum-exhausted by the vacuum pump 246 in a state in which the APC valve 244 of the exhaust pipe 231 is open (preferably, in a state in which the APC valve 244 is fully opened) in order to remove the $NH_3$ gas or reaction byproducts after non-reaction or contribution to formation of the second layer and remaining in the process chamber 201 from the inside of the process chamber 201. In addition, here, supply of the $N_2$ gas into the process chamber 201 is maintained in a state in which the valves 243*g*, 243*e* and 243*f* are open. The $N_2$ gas serves as the purge gas, and thus an effect of removing the $O_2$ gas or the reaction byproduct after non-reaction or contribution to formation of the second layer and remaining in the process chamber 201 from the inside of the process chamber 201 can be increased. In addition, in this case, the supply of the $N_2$ gas into the process chamber 201 is maintained while the valves 243*g*, 243*e*, and 243*f* are open. The $N_2$ gas serves as a purge gas to increase an effect of removing the $NH_3$ gas or the reaction byproducts after non-reaction or contribution to formation of the second layer and remaining in the process chamber 201 from the inside of the process chamber 201.

In addition, here, the gas remaining in the process chamber 201 may not be completely removed, and the inside of the process chamber 201 may not be completely purged. When the gas remaining in the process chamber 201 is minute, there is no bad influence in step 1 performed thereafter. In this case, the flow rate of the $N_2$ gas supplied into the process chamber 201 need not be a large flow rate, and for example, an amount of gas substantially equal to a capacity of the reaction tube 203 (the process chamber 201) may be supplied to perform the purge such that there is no bad influence generated in step 1. As described above, as the inside of the process chamber 201 is not completely purged, the purge time can be reduced to improve throughput. In addition, consumption of the $N_2$ gas can be suppressed to a necessary minimum value.

In addition to the $NH_3$ gas, a gas including a compound such as diazene ($N_2H_2$) gas, hydrazine ($N_2H_4$) gas, $N_3H_8$ gas, or the like, may be used as a nitrogen-containing gas (nitriding gas). In addition to the $N_2$ gas, a rare gas such as Ar gas, He gas, Ne gas, Xe gas, or the like, may be used as the inert gas.

Perform Cycle Predetermined Number of Times

The above-mentioned steps 1 to 3 are set as one cycle, and the cycle may be performed at least once (a predetermined number of times) to form a film including silicon, carbon and nitrogen, i.e., a silicon carbonitride (SiCN) film, which has a predetermined composition and a predetermined film thickness, on the wafer 200. The cycle is preferably performed a plurality of times. That is, it is preferable that a thickness of a SiCN layer formed per cycle be set to be smaller than a desired film thickness, and the cycle be performed a plurality of times until the thickness arrives at the desired film thickness.

According to the second embodiment, effects similar to those of the first embodiment may be achieved.

Specifically, in step 2, during supply of TEA gas, the TEA gas is first supplied at a first flow rate and is then supplied at a second flow rate that is less than the first flow rate while maintaining the pressure in the process chamber 201 at a predetermined pressure after the pressure in the process chamber 201 reaches the pressure process chamber 201. Accordingly, consumption of the TEA gas may be lowered, thereby saving costs for forming the SiCN film.

In addition, in step 2, the degree of opening of the APC valve 244 installed at the exhaust line configured to exhaust the inside of the process chamber 201 is set to be a first degree of opening when the TEA gas is supplied at the first flow rate, and is set to be a second degree of opening that is greater than the first degree of opening when the TEA gas is supplied at the second flow rate that is greater than the first flow rate. Thus, the pressure in the process chamber 201 may be rapidly raised to the predetermined pressure within a short time period, and the amount of carbon (C) present in the process chamber 201 may increase, thereby increasing the concentration of carbon (C) contained in the first layer.

In addition, in step 2, the degree of opening (first degree of opening) of the APC valve 244 installed at the exhaust line configured to exhaust the inside of the process chamber 201 is fully closed to suspend control of the degree of opening of the APC valve 244 (to block the exhaust line) when the TEA gas is supplied at the first flow rate, and the APC valve 244 is opened to perform control of the degree of opening of the APC valve 244 (to open the exhaust line) when the TEA gas is supplied at the second flow rate. Thus, the pressure in the process chamber 201 may be rapidly raised, thereby improving the productivity of forming the SiCN film. In addition, the concentration of carbon (C) contained in the SiCN film may be increased.

In addition, in step 2, the $N_2$ gas is supplied at a third flow rate when the TEA gas is supplied at the first flow rate, and is supplied at a fourth flow rate that is less than the third flow rate when the TEA gas is supplied at the second flow rate, thereby preventing a decrease in the partial pressure of the TEA gas in the process chamber 201 and suppressing the concentration of carbon (C) contained in the SiCN film from being lowered.

In addition, in step 2, a ratio of the flow rate of the TEA gas to that of the $N_2$ gas supplied into the process chamber 201 is maintained constant to maintain the partial pressure of the TEA gas in the process chamber 201 constant, thereby suppressing the concentration of carbon (C) contained in the SiCN film from being lowered.

In addition, in step 2, when the flow rate of the TEA gas supplied into the process chamber 201 is lowered, the concentration of carbon (C) added to the SiCN film may be changed by changing the ratio of the flow rate of the TEA gas to that of the $N_2$ gas supplied into the process chamber 201.

In addition, according to the second embodiment, after the first layer containing Si, N, and C is formed by alternately performing steps 1 and 2, step 3 is performed to supply $NH_3$ gas (which is a nitrogen-containing gas) as a second reactive gas to nitrate the first layer to be modified into a SiCN layer as a second layer, thereby adjusting a composition ratio of carbon to nitrogen contained in the SiCN film. In addition, in this case, the $NH_3$ gas may be thermally activated and supplied to increase Si—N bonds and reduce Si—C bonds and Si—Si bonds in the SiOCN film or the SiOC film, due to an operation of the thermal nitridation. That is, the composition ratio may be changed in a direction of increasing nitrogen concentration and a direction of reducing carbon concentration and silicon concentration. In addition, in this case, a ratio of a nitrogen component (i.e., the concentration of nitrogen) in the SiCN film may be finely controlled by controlling the pressure in the process chamber 201 or process conditions, e.g., a gas supply time, thereby more finely controlling the composition ratio of the SiCN film. Accordingly, the dielectric constant, etching resistance, or insulating properties of the SiCN film or the SiOC film may be improved.

Other Embodiments of the Present Invention

While the present invention has been particularly described with reference to exemplary embodiments thereof, the present invention is not limited thereto and various changes in form and details may be made therein without departing from the spirit and scope of the invention as defined by the appended claims.

For example, although in the previous embodiments, a process of changing the flow rate of TEA gas in two steps so as to form a thin film on the wafer 200 has been described above, the present invention is not limited thereto. That is, the flow rate of the TEA gas may be changed in three steps or four steps, i.e., multi-steps, to form a thin film on the wafer 200. In this case, after the pressure in the process chamber 201 becomes a predetermined pressure, the degree of opening of the APC valve 244 may also be controlled to maintain the pressure in the process chamber 201 at the predetermined pressure, and the flow rate of $N_2$ gas may also be controlled to maintain the partial pressure of the TEA gas in the process chamber 201 at a constant level, thereby obtaining the effects of the previous embodiments.

Figure 9:
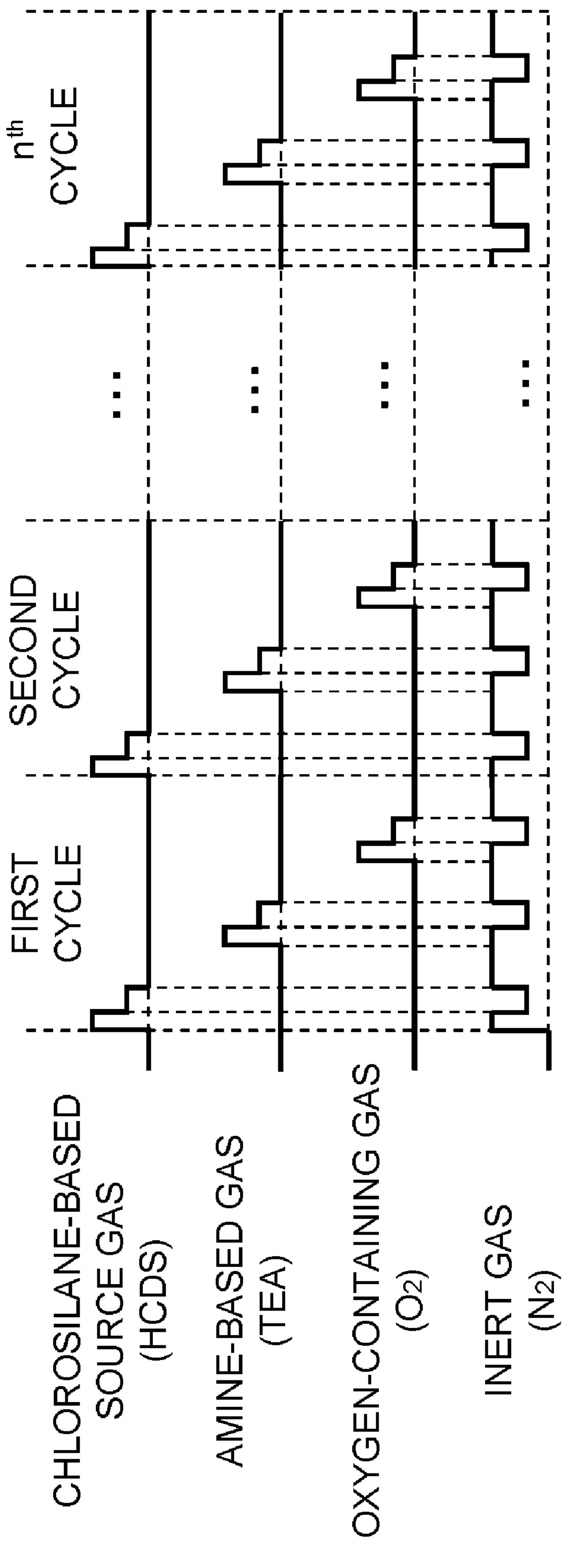
FIG. 9 is a view showing gas supply timing in a film-forming sequence according to another embodiment of the present invention.

In addition, although, according to the previous embodiments, for example, the flow rate of the TEA gas is changed in two steps so as to form a thin film on the wafer 200, the present invention is not limited thereto. That is, a thin film may be formed on the wafer 200 by changing the flow rate of a source gas, e.g., HCDS gas, in two steps, changing the flow rate of an oxygen-containing gas, e.g., $O_2$ gas, in two steps, or changing the flow rate of a nitrogen-containing gas, e.g., $NH_3$ gas, in two steps. That is, during not only a process of supplying the first reactive gas (amine-based gas) but also a process of supplying a source gas or a process of supplying a second reactive gas (oxygen-containing gas or nitrogen-containing gas), a first supply process of supplying the source gas or the second reactive gas, which is to be used during a present process, at the first flow rate in a state in which exhausting of the inside of the process chamber 201 is suspended, until the pressure in the process chamber 201 becomes the same as a predetermined pressure; and a second supply process of supplying the source gas or the second reactive gas, which is to be used during a present process, at the second flow rate (which is less than the first flow rate) while maintaining the pressure in the process chamber 201 at the predetermined pressure after the pressure in the process chamber 201 reaches the predetermined pressure, in a state in which the inside of the process chamber 201 is exhausted may be performed. FIG. 9 illustrates an example of a process of forming a SiOCN film or a SiOC film on the wafer 200 while changing the flow rates of a source gas (HCDS gas), a first reactive gas (TEA gas), and an oxygen-containing gas ($O_2$ gas) in two steps. However, since a carbon-containing gas which is a carbon source, such as TEA gas, is comparatively expensive compared to an oxygen-containing gas or a nitrogen-containing gas and the concentration of carbon (C) in a thin film is comparatively difficult to increase, it is possible to achieve remarkable effects of the present invention when a thin film is formed on the wafer 200 while changing the flow rate of the carbon-containing gas which is a carbon source in two steps.

In addition, although in the previous embodiments, for example, when the first layer containing Si, N, and C is formed, the chlorosilane-based source gas and the amine-based gas are sequentially supplied to the wafer 200 in the process chamber 201, the order of supplying these gases may be reversed. That is, the amine-based gas may be supplied and then the chlorosilane-based source gas may be supplied. In other words, one of the chlorosilane-based source gas and the amine-based gas may be supplied and the other may then be supplied. By reversing the order of supplying these gases as described above, a film quality or composition ratio of a thin film to be formed may be changed.

In addition, although in the previous embodiments, for example, during the process of forming the first layer, the first layer containing Si, N, and C is formed by alternately performing steps 1 and 2, the first layer containing Si, N, and C may be formed by alternately performing steps 1 and 2 a predetermined number of times. That is, during the process of forming the first layer, the first layer containing Si, N, and C may be formed by alternately performing steps 1 and 2 a predetermined number of times (at least once). Specifically, in the first embodiment, a SiOCN film or a SiOC film may be formed on the wafer 200 by performing a cycle a predetermined number of times, the cycle including a process of forming the first layer containing Si, N, and C by alternately performing steps 1 and 2 a predetermined number of times (at least once), and a process of oxidizing the first layer to form a SiOCN layer or a SiOC layer as a second layer by supplying an oxygen-containing gas as a second reactive gas. In the second embodiment, a SiCN film may be formed on the wafer 200 by performing a cycle a predetermined number of times, the cycle including a process of forming the first layer containing Si, N, and C by alternately performing steps 1 and 2 a predetermined number of times (at least once), and a process of nitrating the first layer to form a SiCN layer as a second layer by supplying a nitrogen-containing gas as a second reactive gas.

In addition, although in the previous embodiments, for example, in step 1, when a seed layer containing a specific element (silicon) and a halogen element (chlorine) is formed using a chlorosilane-based source gas is used as a source gas, a silane-based source gas having halogen-based ligands other than chloro groups may be used instead of the chlorosilane-based source gas. For example, a fluorosilane-based source gas may be used instead of the chlorosilane-based source gas. Here, the fluorosilane-based source gas refers to a fluorosilane-based source material in a gaseous state, for example, a gas obtained by evaporating a fluorosilane-based source material in a liquid state under a normal temperature and a normal pressure, or a fluorosilane-based source material in a gaseous state under a normal temperature and a normal pressure. In addition, the fluorosilane-based source material refers to a silane-based source material including a fluoro group serving as a halogen group, i.e., a source material including at least silicon (Si) and fluorine (F). That is, here, the fluorosilane-based source material may be referred to as a halide. For example, a silicon fluoride gas such as tetrafluorosilane, i.e., silicontetrafluoride ($SiF_4$) gas, hexafluorodisilane ($Si_2F_6$) gas, or the like, may be used as the fluorosilane-based source gas. In this case, when the seed layer including a prescribed element and a halogen element is formed, the fluorosilane-based source gas is supplied to the wafer 200 in the processing container. In this case, the seed layer is a layer including Si and F, i.e., a silicon-containing layer including F.

In addition, for example, in the previous embodiments, while the example in which the amine-based gas is used as the first reactive gas when the silicon-containing layer including Cl serving as the seed layer is changed (modified) into the first layer including Si, N and C has been described, for example, a gas including an organic hydrazine compound, i.e., an organic hydrazine-based gas, may be used as the first reactive gas, instead of the amine-based gas. In addition, the gas including the organic hydrazine compound may be simply referred to as an organic hydrazine compound gas or an organic hydrazine gas. Here, the organic hydrazine-based gas refers to an organic hydrazine in a gaseous state, for example, a gas obtained by evaporating an organic hydrazine in a liquid state under a normal temperature and a normal pressure, or a gas including a hydrazine group such as organic hydrazine in a gaseous state under a normal temperature and a normal pressure. The organic hydrazine-based gas is a gas composed of three elements of carbon (C), nitrogen (N) and hydrogen (H) and containing no silicon, or a gas containing no silicon and no metal. For example, a methylhydrazine-based gas obtained by evaporating monomethylhydrazine [$(CH_3)HN_2H_2$, abbreviated to MMH], dimethylhydrazine [$(CH_3)_2N_2H_2$, abbreviated to DMH], trimethylhydrazine [$(CH_3)_2N_2(CH_3)H$, abbreviated to TMH], or the like, or an ethylhydrazine-based gas obtained by evaporating ethylhydrazine [$(C_2H5)HN_2H_2$, abbreviated to EH] or the like may be used as the organic hydrazine-based gas. In this case, the organic hydrazine-based gas is supplied to the wafer 200 in the processing container when the silicon-containing layer including Cl is changed (modified) into the first layer including Si, N and C.

In addition, in the previous embodiments, while the example in which the SiOCN film or the SiOC film is formed on the wafer 200 using a source gas, an amine-based gas, or an oxygen-containing gas or the example in which the SiCN film is formed on the wafer 200 using a source gas, an amine-based gas, or a nitrogen-containing gas has been described, the present invention is not limited thereto.

For example, even when a SiOCN film or a SiOC film is formed on the wafer 200 using a source gas, an amine-based gas, a carbon-containing gas, and an oxygen-containing gas, or when a SiCN film is formed on the wafer 200 using a source gas, an amine-based gas, a carbon-containing gas, and a nitrogen-containing gas, the present invention may be applied thereto. That is, the present invention may be applied to a case in which a cycle including a source gas supply process, an amine-based gas supply process, a carbon-containing gas supply process, and an oxygen-containing gas supply process is performed a predetermined number of times to form a SiOCN film or a SiOC film on the wafer 200, or a case in which a cycle including a source gas supply process, an amine-based gas supply process, a carbon-containing gas supply process, and a nitrogen-containing gas supply process is performed a predetermined number of times to form a SiCN film on the wafer 200.

In addition, for example, the present invention may be applied to a case in which a SiCN film is formed on the wafer 200 using a source gas and an amine-based gas or a case in which a SiCN film is formed on the wafer 200 using a source gas, an amine-based gas, and a carbon-containing gas. That is, the present invention may also be applied to a case in which a cycle including a source gas supply process and an amine-based gas supply process is performed a predetermined number of times to form a SiCN film on the wafer 200 or a case in which a cycle including a source gas supply process, an amine-based gas supply process, and a carbon-containing gas supply process is performed a predetermined number of times to form a SiCN film on the wafer 200.

In addition, the present invention may be applied to a case in which a silicon boron carbonitride (SiBCN) film is formed on the wafer 200 using a source gas, an amine-based gas, and a boron-containing gas, a case in which a SiBCN is formed on the wafer 200 using a source gas, an amine-based gas, a boron-containing gas, a carbon-containing gas, and a nitrogen-containing gas, or a case in which a silicon boronitride (SiBN) film is formed on the wafer 200 using a source gas, an amine-based gas, a boron-containing gas, and a nitrogen-containing gas. That is, the present invention may also be applied to a case in which a cycle including a source gas supply process, an amine-based gas supply process, and a boron-containing gas supply process is performed a predetermined number of times to form a SiBCN film on the wafer 200, a case in which a cycle including a source gas supply process, an amine-based gas supply process, a boron-containing gas supply process, a carbon-containing gas supply process, and a nitrogen-containing gas supply process is performed a predetermined number of times to form a SiBCN film on the wafer 200, or a case in which a cycle including a source gas supply process, an amine-based gas supply process, a boron-containing gas supply process, and a nitrogen-containing gas supply process is performed a predetermined number of times to form a SiBN film on the wafer 200.

In addition, the present invention may be applied to a case in which a boron carbonitride (BCN) film is formed on the wafer 200 using a boron-containing gas and an amine-based gas, a case in which a BCN film is formed on the wafer 200 using a boron-containing gas, an amine-based gas, a carbon-containing gas, and a nitrogen-containing gas, or a case in which a boron nitride (BN) film is formed on the wafer 200 using a boron-containing gas, an amine-based gas, and a nitrogen-containing gas. That is, the present invention may also be applied to a case in which a cycle including a boron-containing gas supply process and an amine-based gas supply process is performed a predetermined number of times to form a BCN film on the wafer 200, a case in which a cycle including a boron-containing gas supply process, an amine-based gas supply process, a carbon-containing gas supply process, and a nitrogen-containing gas supply process is performed a predetermined number of times to form a BCN film on the wafer 200, or a case in which a cycle including a boron-containing gas supply process, an amine-based gas supply process, and a nitrogen-containing gas supply process is performed a predetermined number of times to form a BN film on the wafer 200.

In this case, for example, a hydrocarbon-based gas, such as acetylene ($C_2H_2$) gas, propylene ($C_3H_6$) gas, or ethylene ($C_2H_4$) gas, may be used as the carbon-containing gas. In addition, for example, an inorganic gas such as boron trichloride ($BCl_3$) gas or diborane ($B_2H_6$) gas, or an organic gas such as a borazine-based gas (hereinafter referred to as an organic borazine compound) may be used as the boron-containing gas. As the source gas, the amine-based gas, the oxygen-containing gas, and the nitrogen-containing gas may be the same as those in the previous embodiments. In addition, in this case, process conditions may be the same as those in the previous embodiments.

Furthermore, in this case, during the amine-based gas supply process, the flow rate of the amine-based gas may be changed in two steps as described above. The flow rates of other gases (the source gas, the boron-containing gas, the carbon-containing gas, the oxygen-containing gas, and nitrogen-containing gas) may be changed in two steps as described above. However, since the amine-based gas or the carbon-containing gas which is a carbon source, e.g., $C_3H_6$ gas, is comparatively expensive compared to the oxygen-containing gas or the nitrogen-containing gas and the concentration of carbon (C) in a thin film is comparatively difficult to increase, it is possible to achieve remarkable effects of the present invention when a thin film is formed on the wafer 200 while changing the flow rate of the amine-based gas or the flow rate of the carbon-containing gas in two steps. In addition, since the organic borazine compound gas is comparatively expensive, it is also possible to achieve remarkable effects of the present invention when a thin film is formed on the wafer 200 while changing the flow rate of the organic borazine compound gas used as the boron-containing gas.

As described above, the present invention may be preferably applied to an entire substrate processing process using a source gas and an amine-based gas.

In addition, the present invention may be applied to, for example, a case in which a SiCN film is formed on the wafer 200 using a source gas and an aminosilane-based source gas, or a case in which a SiBCN film or a SiBN film having a borazine annular skeleton is formed on the wafer 200 using a source gas and an organic borazine compound gas. That is, the present invention may be applied to a case in which a SiCN film is formed on the wafer 200 by performing a cycle including a source gas supply process and an aminosilane-based source gas supply process a predetermined number of times, or a case in which a SiBCN film or a SiBN film having a borazine annular skeleton is formed on the wafer 200 by performing a cycle including a source gas supply process and an organic borazine compound gas supply process a predetermined number of times.

In this case, for example, trisdimethylaminosilane ($Si[N(CH_3)_2]_3H$, abbreviated to 3DMAS) or the like may be used as the aminosilane-based source gas. Further, for example, n,n',n"-trimethylborazine (abbreviated to TMB) or the like may be used as the organic borazine compound gas. The source gas in the previous embodiments may be used as the source gas. In this case, process conditions may be, similar to, for example, those of the above-mentioned embodiment.

In addition, in this case, during the aminosilane-based source gas supply process, the flow rate of the aminosilane-based source gas may be changed in two steps as described above. During the organic borazine compound gas supply process, the flow rate of the organic borazine compound gas may be changed in two steps as described above. During the source gas supply process, the flow rate of the source gas may be changed in two steps as described above. However, since the aminosilane-based source gas or the organic borazine compound gas is comparatively expensive, it is possible to achieve remarkable effects of the present invention when a thin film is formed on the wafer 200 while changing the flow rates of these gases in two steps.

As described above, the present invention may be applied to a substrate processing process using the source gas and the aminosilane-based gas or a substrate processing process using the source gas and the organic borazine compound gas.

In addition, in the previous embodiments, the example in which an amine-based gas which is a gas containing carbon and nitrogen (carbon- and nitrogen-containing gas) is used as a reactive gas has been described above, but the present invention is not limited thereto. For example, the present invention may also be applied to a case in which two types of gases, e.g., a carbon-containing gas and a nitrogen-containing gas, are used as a reactive gas, instead of the amine-based gas.

For example, the present invention may also be applied to a case in which a cycle including a source gas supply process, a carbon-containing gas supply process, a nitrogen-containing gas supply process, and an oxygen-containing gas supply process is performed a predetermined number of times to form a SiOCN film on the wafer 200, or a case in which a cycle including a source gas supply process, a carbon-containing gas supply process, and a nitrogen-containing gas supply process is performed a predetermined number of times to form a SiCN film on the wafer 200. In this case, a hydrocarbon-based gas, such as propylene ($C_3H_6$) gas, acetylene ($C_2H_2$) gas, or ethylene ($C_2H_4$) gas, may be used as the carbon-containing gas, and the nitrogen-containing gas according to the second embodiment described above may be used as the nitrogen-containing gas.

Furthermore, the present invention may also be applied to a case in which a cycle including a source gas supply process, a carbon-containing gas supply process, a boron-containing gas supply process, and a nitrogen-containing gas supply process is performed a predetermined number of times to form a SiBCN film on the wafer 200. In this case, the carbon-containing gas, the boron-containing gas, and the nitrogen-containing gas are as described above.

In addition, the present invention may also be applied to a case in which a cycle including a boron-containing gas supply process, a carbon-containing gas supply process, and a nitrogen-containing gas supply process is performed a predetermined number of times to form a BCN film on the wafer 200, or a case in which a cycle including a boron-containing gas supply process and a nitrogen-containing gas supply process is performed a predetermined number of times to form a BN film on the wafer 200. In this case, the boron-containing gas, the carbon-containing gas, and the nitrogen-containing gas are as described above.

In this case, during the carbon-containing gas supply process, the flow rate of the carbon-containing gas may be changed in two steps as described above, and the flow rates of other gases (the source gas, the oxygen-containing gas, the nitrogen-containing gas, and boron-containing gas) may be changed in two steps as described above. However, since a carbon-containing gas which is a carbon source, such as $C_3H_6$ gas, is comparatively expensive compared to an oxygen-containing gas or a nitrogen-containing gas and the concentration of carbon (C) in a thin film is comparatively difficult to increase, it is possible to achieve remarkable effects of the present invention when a thin film is formed on the wafer 200 while changing the flow rate of the carbon-containing gas which is a carbon source in two steps.

As described above, the present invention may be preferably applied to a case in which a thin film is formed using a reactive gas, such as a source gas and carbon-containing gas.

When a silicon-based insulating film or a boron-based insulating film formed by the methods according to the previous embodiments and modified examples thereof is used as a sidewall spacer, a device-forming technique having a small leak current and good machinability can be provided.

When a silicon-based insulating film or a boron-based insulating film formed by the methods according to the previous embodiments and modified examples thereof is used as an etching stopper, a device-forming technique having good machinability can be provided.

According to the previous embodiments or modified examples thereof, a silicon-based insulating film or a boron-based insulating film having an ideal stoichiometric ratio can be formed without using plasma even in a low temperature region. In addition, since the silicon-based insulating film or the boron-based insulating film can be formed without using plasma, it may be applied to a process in which plasma damage may occur, for example, a process of forming an SADP film of DPT.

In addition, although in the previous embodiments, the example in which the silicon-based insulating layer (the SiOCN film, the SiOC film, and the SiCN film) including silicon (which is a semiconductor element) serving as an oxycarbonitride film, an oxycarbide film, or a carbonitride film has been described, the present invention may be applied to a case in which a metal-based thin film including a metal element, such as titanium (Ti), zirconium (Zr), hafnium (Hf), tantalum (Ta), aluminum (Al), molybdenum (Mo), etc., is formed.

That is, the present invention may be preferably applied to a case in which a metal oxycarbonitride film, such as a titanium oxycarbonitride (TiOCN) film, a zirconium oxycarbonitride (ZrOCN) film, a hafnium oxycarbonitride (HfOCN) film, a tantalum oxycarbonitride (TaOCN) film, an aluminum oxycarbonitride (AlOCN) film, a molybdenum oxycarbonitride (MoOCN) film, etc. is formed.

In addition, for example, the present invention may be applied to a case in which a metal oxycarbide film, such as a titanium oxycarbide (TiOC) film, a zirconium oxycarbide (ZrOC) film, a hafnium oxycarbide (HfOC) film, a tantalum oxycarbide (TaOC) film, an aluminum oxycarbide (AlOC) film, a molybdenum oxycarbide (MoOC) film, etc. is formed.

Further, for example, the present invention may be applied to a case in which a metal carbonitride film, such as a titanium carbonitride (TiCN) film, a zirconium carbonitride (ZrCN) film, a hafnium carbonitride (HfCN) film, a tantalum carbonitride (TaCN) film, an aluminum carbonitride (AlCN) film, a molybdenum carbonitride (MoCN) film, etc. is formed.

In this case, the film-forming may be performed in a sequence similar to that of any of the previous embodiments using a source gas including a metal element and a halogen element, instead of the chlorosilane-based source gas as in the previous embodiments. That is, a metallic thin film may be formed on the wafer 200 in the process chamber 201 by performing a cycle a predetermined number of times, the cycle including a process of supplying a source gas including a metal element and a halogen element to the wafer 200 in the process chamber 201 and a process of supplying a reactive gas to the wafer 200.

Specifically, a metal-based thin film (a metal oxycarbonitride film, a metal oxycarbide film, or a metal carbonitride film) having a predetermined composition and a predetermined film thickness may be formed on the wafer 200 by performing a cycle a predetermined number of times, the cycle including: a process of forming a first layer including a meal element, nitrogen, and carbon on the wafer 200 by alternately performing a process of supplying a source gas including a metal element and a halogen element to the wafer 200 in the process chamber 201 and a process of supplying a first reactive gas to the wafer 200 in the process chamber **201*a* predetermined number of times; and a process of forming a second layer by supplying a second reactive gas, which is different from the source gas and the first reactive gas, to the wafer 200 in the process chamber 201** to modify the first layer.

In this case, for example, the flow rate of the first reactive gas is changed in two steps as described above during the process of supplying the first reactive gas. In addition, during the process of supplying the source gas or the process of supplying the second reactive gas, the flow rate of the source gas or the second reactive gas may be changed in two steps as described above.

For example, when a metal-based thin film (a TiOCN film, a TiOC film, or a TiCN film) including Ti is formed, a gas including Ti and a chloro group such as titanium tetrachloride ($TiCl_4$) or a gas including Ti and a fluoro group such as titanium tetrafluoride ($TiF_4$) or the like may be used as a source gas. Gases similar to those of the previous embodiments may be used as the first and second reactive gases. In this case, process conditions may be, for example, similar to those of the above-mentioned embodiment.

In addition, for example, when a metal-based thin film (a ZrOCN film, a ZrOC film, or a ZrCN film) including Zr is formed, a gas including Zr and a chloro group such as zirconium tetrachloride ($ZrCl_4$) or the like, or a gas including Zr and a fluoro group such as zirconium tetrafluoride ($ZrF_4$) or the like may be used as the source gas. Gases similar to those of the previous embodiments may be used as the first and second reactive gases. In this case, process conditions may be, for example, similar to those of the above-mentioned embodiment.

Further, for example, when a metal-based thin film (a HfOCN film, a HfOC film, or a HfCN film) including Hf is formed, a gas including Hf and a chloro group such as hafnium tetrachloride ($HfCl_4$) or the like, or a gas including Hf and a fluoro group such as hafnium tetrafluoride ($HfF_4$) or the like may be used as the source gas. Gases similar to those of the previous embodiments may be used as the first and second reactive gases. In this case, process conditions may be, for example, similar to those of the above-mentioned embodiment.

In addition, for example, when a metal-based thin film (a TaOCN film, a TaOC film, or a TaCN film) including Ta is formed, a gas including Ta and a chloro group such as tantalum pentachloride ($TaCl_5$) or the like, or a gas including Ta and a fluoro group such as tantalum pentafluoride ($TaF_5$) or the like may be used as the source gas. Gases similar to those of the previous embodiments may be used as the first and second reactive gases. In this case, process conditions may be, for example, similar to those of the above-mentioned embodiment.

In addition, for example, when a metal-based thin film (an AlOCN film, an AlOC film, or an AlCN film) including Al is formed, a gas including Al and a chloro group such as aluminum trichloride ($AlCl_3$) or the like, or a gas including Al and a fluoro group such as aluminum trifluoride ($AlF_3$) or the like may be used as the source gas. Gases similar to those of the previous embodiments may be used as the first and second reactive gases. In this case, process conditions may be, for example, similar to those of the above-mentioned embodiment.

In addition, for example, when a metal-based thin film (a MoOCN film, a MoOC film, or a MoCN film) including Mo is formed, a gas including Mo and a chloro group such as molybdenum pentachloride ($MoCl_5$) or the like, or a gas including Mo and a fluoro group such as molybdenum pentafluoride ($MoF_5$) or the like may be used as the source gas. Gases similar to those of the previous embodiments may be used as the first and second reactive gases. In this case, process conditions may be, for example, similar to those of the above-mentioned embodiment.

That is, the present invention may also be preferably applied to a case in which a thin film having a specific element, such as a semiconductor element or a metal element, is formed.

A plurality of process recipes (programs each storing a process sequence or process conditions) that are used to form various thin films are preferably prepared according to the details of substrate processing (film type, composition ratio, film quality, film thickness, etc. of the thin film to be formed). When substrate processing starts, an appropriate process recipe is preferably selected among the plurality of process recipes, according to the details of substrate processing. Specifically, the plurality of process recipes that are individually prepared according to the details of substrate processing are preferably stored (installed) beforehand in the memory device 121*c* included in the substrate processing apparatus via an electrical communication line or a non-transitory computer-readable recording medium on which the process recipes are recorded (external memory device 123). In addition, when substrate processing starts, the CPU 121*a* included in the substrate processing apparatus preferably appropriately selects a process recipe matching the details of substrate processing among the plurality of recipes stored in the memory device 121*c*. By configuring the plurality of process recipes as described above, thin films having various film types, composition ratios, film qualities, and film thicknesses may be generally and reproducibly formed using one substrate processing apparatus. Furthermore, load on an operator's manipulation (for example, when a processing sequence or process conditions are input) may be reduced, and substrate processing may be rapidly started without causing errors in manipulation.

However, the plurality of process recipes described above are not limited to new ones, and may be prepared by, for example, modifying process recipes installed in the substrate processing apparatus. When a process recipe is modified, the modified process recipe may be installed in the substrate processing apparatus via an electrical communication line or a non-transitory computer-readable recording medium on which the process recipes are recorded. Otherwise, the existing process recipes installed in the substrate processing apparatus may be directly changed by manipulating the I/O device 122 included in the substrate processing apparatus.

In the previous embodiments, while the case in which the thin film is formed using the batch type substrate processing apparatus for processing a plurality of substrates at a time has been described, the present invention is not limited thereto and may be applied to the case in which the thin film is formed using a single wafer type substrate processing apparatus for processing one or a plurality of substrates at a time. In addition, in the previous embodiments, while the example in which the thin film is formed using the substrate processing apparatus including the hot wall type processing furnace has been described, the present invention is not limited thereto and may be applied to a case in which a thin film is formed using the substrate processing apparatus including a cold wall type processing furnace.

The previous embodiments may be appropriately combined and used.

Examples

As an example of the present invention, a SiOCN film was formed on a wafer according to the film-forming sequence according to the first embodiment described above. In addition, in a first TEA gas supply process in step 2, the flow rate (first flow rate) of TEA gas was set to be within a range of 200 to 1,000 sccm and a gas supply time was set to be within a range of 10 to 20 seconds. In addition, in a second TEA gas supply process, the flow rate (second flow rate) of the TEA gas was set to be within a range of 100 to 500 sccm and a gas supply time was set to be within a range of 20 to 100 seconds. The other film-forming conditions (process conditions in each step) were the same as those in the first embodiment.

According to a comparative example, a SiOCN film was formed on a wafer without changing the flow rate of TEA gas supplied into a process chamber in the film-forming sequence according to the first embodiment. In addition, in step 2 (TEA gas supply process), the flow rate of the TEA gas was set to be within a range of 200 to 1,000 sccm and a gas supply time was set to be within a range of 30 to 120 seconds. The other film-forming conditions (process conditions in each step) were the same as those in the first embodiment. As a result, in both the film-forming sequence according to the example of the present invention and the film-forming sequence according to the comparative example, a SiOCN film having about 10 to 20% of carbon concentration was also formed. In addition, in the film-forming sequence according to the example of the present invention, a total supply rate (consumption rate) of the TEA gas was less and a film-forming rate was higher, compared to the film-forming sequence according to the comparative example. In addition, in the film-forming sequence according to the example of the present invention, the total supply rate of the TEA gas was reduced to 60 to 70% of that in the film-forming sequence according to the comparative example.

According to the present invention, a method of manufacturing a semiconductor device, which is capable of reducing a total supply rate of reactive gases without lowering the concentrations of, for example, oxygen, nitrogen, and carbon contained in a thin film, a substrate processing apparatus, and a non-transitory computer-readable recording medium.

Exemplary Embodiments of the Present Invention

Exemplary embodiments of the present invention will now be supplementarily stated.

Supplementary Note 1

According to an embodiment of the present invention, there is provided a method of manufacturing a semiconductor device, including: forming a thin film on a substrate by performing a cycle a predetermined number of times, the cycle including: (a) supplying a source gas to the substrate in a process chamber; and (b) supplying a reactive gas to the substrate in the process chamber, wherein at least one of the steps (a) and (b) includes: (c) supplying the source gas or the reactive gas at a first flow rate with an exhaust of an inside of the process chamber being suspended until an inner pressure of the process chamber reaches a predetermined pressure; and (d) supplying the source gas or the reactive gas at a second flow rate less than the first flow rate with the exhaust of the inside of the process chamber being performed while maintaining the inner pressure of the process chamber at the predetermined pressure after the inner pressure of the process chamber reaches the predetermined pressure.

Supplementary Note 2

In the method of Supplementary Note 1, the step (c) may include setting a degree of opening of an exhaust valve installed at an exhaust line configured to exhaust the inside of the process chamber to a fully closed state, and the step (d) may include opening the exhaust valve.

Supplementary Note 3

In the method of Supplementary Note 1 or 2, the step (c) may include suspending control of a degree of opening of an exhaust valve installed at an exhaust line configured to exhaust the inside of the process chamber, and the step (d) may include performing the control of the degree of opening of the exhaust valve.

Supplementary Note 4

In the method of Supplementary Note 3, the step (c) may include setting the degree of opening of the exhaust valve to a fully closed state.

Supplementary Note 5

In the method of Supplementary Note 1, the step (c) may include blocking an exhaust line configured to exhaust the inside of the process chamber, and the step (d) may include opening the exhaust line.

Supplementary Note 6

In the method of Supplementary Note 1 or 5, each of the steps (c) and (d) may include supplying an inert gas together with the source gas or the reactive gas.

Supplementary Note 7

In the method of Supplementary Note 6, each of the steps (c) and (d) may include maintaining a ratio of a flow rate of the source gas or the reactive gas to that of the inert gas at a constant level.

Supplementary Note 8

In the method of Supplementary Note 6, the step (c) may include supplying the inert gas at a third flow rate, and the step (d may include supplying the inert gas at a fourth flow rate that is less than the third flow rate.

Supplementary Note 9

In the method of Supplementary Note 8, during the steps (c) and (d), a ratio of the first flow rate to the third flow rate is same as a ratio of the second flow rate to the fourth flow rate.

Supplementary Note 10

In the method of Supplementary Note 8, during the steps (c) and (d), a ratio of the first flow rate to a sum of the first flow rate and the third flow rate is same as a ratio of the second flow rate to a sum of the second flow rate and the fourth flow rate.

Supplementary Note 11

In the method of any one of Supplementary Notes 1 to 10, each of the steps (c) and (d) may include maintaining a partial pressure of the source gas or the reactive gas in respective step at a constant level at least after the inner pressure of the process chamber reaches the predetermined pressure.

Supplementary Note 12

In the method of any one of Supplementary Notes 1 to 11, the step (a) may include the steps (c) and (d).

Supplementary Note 13

In the method of any one of Supplementary Notes 1 to 12, the step (b) may include the steps (c) and (d).

Supplementary Note 14

In the method of any one of Supplementary Notes 1 to 13, the reactive gas may include a carbon-containing gas.

Supplementary Note 15

In the method of any one of Supplementary Notes 1 to 14, the reactive gas may include a gas containing carbon and nitrogen.

Supplementary Note 16

In the method of any one of Supplementary Notes 1 to 15, the reactive gas may include at least one of a hydrocarbon-based gas and an amine-based gas.

Supplementary Note 17

According to another embodiment of the present invention, there is provided a substrate processing method, including forming a thin film on a substrate by performing a cycle a predetermined number of times, the cycle including: (a) supplying a source gas to the substrate in a process chamber; and (b) supplying a reactive gas to the substrate in the process chamber, wherein at least one of the steps (a) and (b) includes: (c) supplying the source gas or the reactive gas at a first flow rate with an exhaust of an inside of the process chamber being suspended until an inner pressure of the process chamber reaches a predetermined pressure; and (d) supplying the source gas or the reactive gas at a second flow rate less than the first flow rate with the exhaust of the inside of the process chamber being performed while maintaining the inner pressure of the process chamber at the predetermined pressure after the inner pressure of the process chamber reaches the predetermined pressure.

Supplementary Note 18

According to still another embodiment of the present invention, there is provided a substrate processing apparatus including: a process chamber configured to accommodate a substrate; a source gas supply system configured to supply a source gas into the process chamber; a reactive gas supply system configured to supply a reactive gas into the process chamber; an exhaust system configured to exhaust an inside of the process chamber; a pressure regulator configured to regulate pressure in the process chamber; and a control unit configured to control the source gas supply system, the reactive gas supply system, the exhaust system, and the pressure regulator to form a thin film on the substrate by performing a cycle a predetermined number of times, the cycle including: (a) supplying a source gas to the substrate in a process chamber; and (b) supplying a reactive gas to the substrate in the process chamber, wherein at least one of the steps (a) and (b) includes: (c) supplying the source gas or the reactive gas at a first flow rate with an exhaust of an inside of the process chamber being suspended until an inner pressure of the process chamber reaches a predetermined pressure; and (d) supplying the source gas or the reactive gas at a second flow rate less than the first flow rate with the exhaust of the inside of the process chamber being performed while maintaining the inner pressure of the process chamber at the predetermined pressure after the inner pressure of the process chamber reaches the predetermined pressure.

Supplementary Note 19

According to yet another embodiment of the present invention, there is provided a program that causes a computer to perform a sequence of forming a thin film on a substrate by performing a cycle a predetermined number of times, the cycle including: (a) supplying a source gas to the substrate in a process chamber; and (b) supplying a reactive gas to the substrate in the process chamber, wherein at least one of the sequences (a) and (b) includes: (c) supplying the source gas or the reactive gas at a first flow rate with an exhaust of an inside of the process chamber being suspended until an inner pressure of the process chamber reaches a predetermined pressure; and (d) supplying the source gas or the reactive gas at a second flow rate less than the first flow rate with the exhaust of the inside of the process chamber being performed while maintaining the inner pressure of the process chamber at the predetermined pressure after the inner pressure of the process chamber reaches the predetermined pressure.

Supplementary Note 20

According to yet another embodiment of the present invention, there is provided a non-transitory computer-readable recording medium storing a program that causes a computer to perform a sequence of forming a thin film on a substrate by performing a cycle a predetermined number of times, the cycle including: (a) supplying a source gas to the substrate in a process chamber; and (b) supplying a reactive gas to the substrate in the process chamber, wherein at least one of the sequences (a) and (b) includes: (c) supplying the source gas or the reactive gas at a first flow rate with an exhaust of an inside of the process chamber being suspended until an inner pressure of the process chamber reaches a predetermined pressure; and (d) supplying the source gas or the reactive gas at a second flow rate less than the first flow rate with the exhaust of the inside of the process chamber being performed while maintaining the inner pressure of the process chamber at the predetermined pressure after the inner pressure of the process chamber reaches the predetermined pressure.

What is claimed is:

1. A method of manufacturing a semiconductor device, comprising:

forming a thin film on a substrate by performing a cycle a predetermined number of times, the cycle comprising:

(a) supplying a source gas to the substrate in a process chamber; and (b) supplying a reactive gas to the substrate in the process chamber, wherein at least one of (a) and (b) includes:

(c) supplying a gas used in the at least one of (a) and (b) at a first flow rate with an exhaust of an atmosphere in the process chamber through an exhaust line being suspended by fully closing an exhaust valve installed at the exhaust line to increase an inner pressure in the process chamber until the inner pressure of the process chamber reaches a predetermined pressure; and (d) supplying the gas used in the at least one of (a) and (b) at a second flow rate less than the first flow rate with the exhaust of the atmosphere in the process chamber through the exhaust line being performed by opening the exhaust valve while maintaining the inner pressure of the process chamber at the predetermined pressure by controlling degree of opening of the exhaust valve after the inner pressure of the process chamber reaches the predetermined pressure.

2. The method of claim 1, wherein (c) comprises suspending control of the degree of opening of the exhaust valve, and (d) comprises performing the control of the degree of opening of the exhaust valve.

3. The method of claim 2, wherein (c) comprises setting the degree of opening of the exhaust valve to a fully closed state.

4. The method of claim 1, wherein (c) comprises blocking the exhaust line, and (d) comprises opening the exhaust line.

5. The method of claim 1, wherein each of (c) and (d) comprises supplying an inert gas together with the gas used in the at least one of (a) and (b).

6. The method of claim 5, wherein each of (c) and (d) comprises maintaining a ratio of a flow rate of the gas used in the at least one of (a) and (b) to that of the inert gas at a constant level.

7. The method of claim 5, wherein (c) comprises supplying the inert gas at a third flow rate, and (d) comprises supplying the inert gas at a fourth flow rate that is less than the third flow rate.

8. The method of claim 7, wherein during (c) and (d), a ratio of the first flow rate to the third flow rate is same as a ratio of the second flow rate to the fourth flow rate.

9. The method of claim 7, wherein during (c) and (d), a ratio of the first flow rate to a sum of the first flow rate and the third flow rate is same as a ratio of the second flow rate to a sum of the second flow rate and the fourth flow rate.

10. The method of claim 1, wherein each of (c) and (d) comprises maintaining a partial pressure of the gas used in the at least one of (a) and (b) at a constant level at least after the inner pressure of the process chamber reaches the predetermined pressure.

11. The method of claim 1, wherein (a) comprises (c) and (d).

12. The method of claim 1, wherein (b) comprises (c) and (d).

13. The method of claim 1, wherein the reactive gas comprises at least one selected from a group consisting of a gas containing carbon and nitrogen and a carbon-containing gas.

14. The method of claim 1, wherein the reactive gas comprises at least one selected from a group consisting of a hydrocarbon-based gas and an amine-based gas.

15. A method of manufacturing a semiconductor device, comprising:

forming a thin film on a substrate by performing a cycle a predetermined number of times, the cycle comprising:

(a) supplying a source gas to the substrate in a process chamber; and (b) supplying a reactive gas to the substrate in the process chamber, wherein (a) includes:

(c) supplying the source gas at a first flow rate with an exhaust of an atmosphere in the process chamber through an exhaust line being suspended by fully closing an exhaust valve installed at the exhaust line to increase an inner pressure in the process chamber until the inner pressure of the process chamber reaches a predetermined pressure; and (d) supplying the source gas at a second flow rate less than the first flow rate with the exhaust of the atmosphere in the process chamber being performed by opening the exhaust valve while maintaining the inner pressure of the process chamber at the predetermined pressure by controlling degree of opening of the exhaust valve after the inner pressure of the process chamber reaches the predetermined pressure.

16. The method of claim 15, wherein (b) includes: (e) supplying the reactive gas at third flow rate with the exhaust of the atmosphere in the process chamber through athe exhaust line being suspended by fully closing an exhaust valve until the inner pressure of the process chamber reaches a predetermined pressure; and (f) supplying the reactive gas at fourth flow rate less than the third flow rate with the exhaust of the atmosphere in the process chamber being performed by opening the exhaust valve while maintaining the inner pressure of the process chamber at the predetermined pressure by controlling degree of opening of the exhaust valve after the inner pressure of the process chamber reaches the predetermined pressure.

17. A method of manufacturing a semiconductor device, comprising:

forming a thin film on a substrate by performing a cycle a predetermined number of times, the cycle comprising:

(a) supplying a source gas to the substrate in a process chamber; and (b) supplying a reactive gas to the substrate in the process chamber, wherein (b) includes:

(c) supplying the reactive gas at a first flow rate with an exhaust of an atmosphere in the process chamber through an exhaust line being suspended by fully closing an exhaust valve installed at the exhaust line to increase an inner pressure in the process chamber until the inner pressure of the process chamber reaches a predetermined pressure; and (d) supplying the reactive gas at a second flow rate less than the first flow rate with the exhaust of the atmosphere in the process chamber being performed by opening the exhaust valve while maintaining the inner pressure of the process chamber at the predetermined pressure by controlling degree of opening of the exhaust valve after the inner pressure of the process chamber reaches the predetermined pressure.

* * * * *